United States Patent [19]
Matsumoto

[11] Patent Number: 5,420,634
[45] Date of Patent: May 30, 1995

[54] SOLID STATE IMAGING DEVICE
[75] Inventor: Kazuya Matsumoto, Nagano, Japan
[73] Assignee: Olympus Optical Co., Ltd., Tokyo, Japan
[21] Appl. No.: 232,429
[22] Filed: Apr. 21, 1994

Related U.S. Application Data
[63] Continuation of Ser. No. 836,393, Feb. 18, 1992, abandoned.

[30] Foreign Application Priority Data
Apr. 1, 1991 [JP] Japan .................. 3-092682
[51] Int. Cl.6 ........................................... H04N 5/335
[52] U.S. Cl. .................... 348/311; 348/302
[58] Field of Search .............. 348/241, 243, 248, 311, 348/315, 294; 357/432, 438, 129, 168, 199; 250/208.1, 201.1; H04N 5/335

[56] References Cited
U.S. PATENT DOCUMENTS
4,694,185 9/1987 Weiss .................. 250/578

FOREIGN PATENT DOCUMENTS
61-157178 7/1986 Japan ............ H04N 5/335
2-111069 4/1990 Japan .
4-24964 1/1992 Japan ............ H04N 5/335

OTHER PUBLICATIONS
A New MOS Image Sensor Operating in a Non-Destructive Readout Mode by Nakamura et al (1986 IEEE IEDM 86-353).

Primary Examiner—Joseph Mancuso
Assistant Examiner—Tuan V. Ho
Attorney, Agent, or Firm—Armstrong, Westerman, Hattori, McLeland & Naughton

[57] ABSTRACT

A solid state imaging device in which a protection film which is transparent with respect to visible light is formed on a pixel array in which a multiplicity of pixels, each of which includes at least a light receiving portion and an accumulating portion, are arranged and which has a microlens array which is composed of a multiplicity of microlenses selectively disposed on said protection film to correspond to each of the light receiving pixels and made of organic or inorganic material, the solid state imaging device being constituted in such a manner that the optical axis and the focal point of each of microlens are present in the high electric field region of the light receiving portion and the accumulating portion of each of the pixels, the high electric field region being a region in which an avalanche phenomenon takes place.

6 Claims, 18 Drawing Sheets

FIG. 20A
FIG. 20B
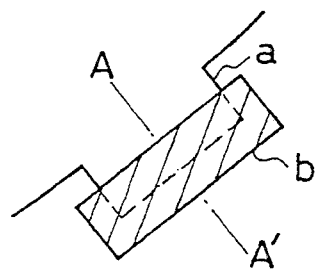
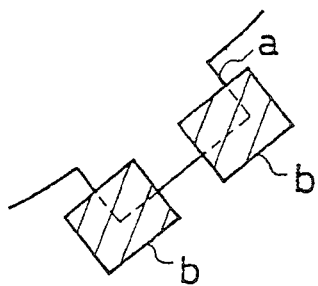
FIG. 20C
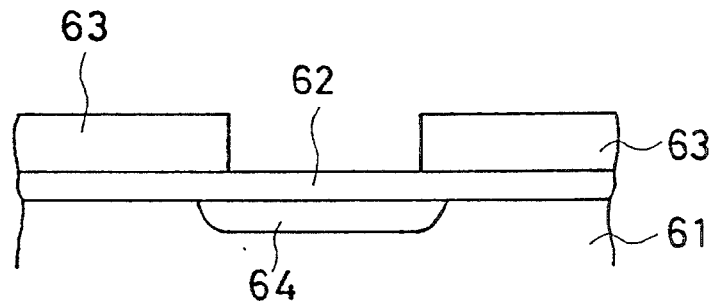
FIG. 20D
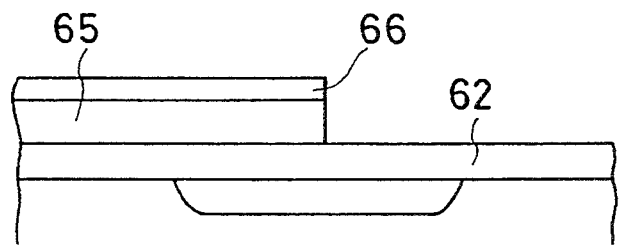
FIG. 20E
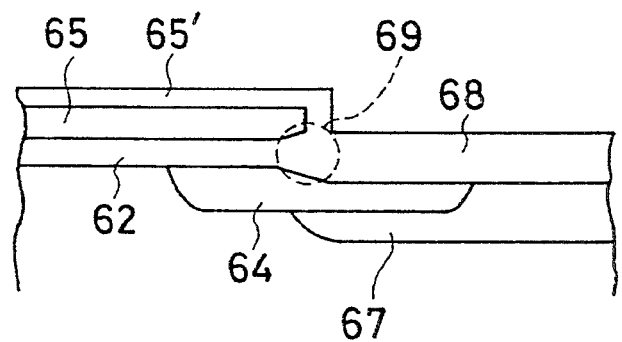

SOLID STATE IMAGING DEVICE

This application is a continuation of application Ser. No. 07/836,393 filed Feb. 18, 1992, now abandoned.

BACKGROUND OF THE INVENTION

1. Field of the Invention

The present invention relates to a solid state imaging device having a microlens array formed on a pixel array thereof.

2. Description of Related Art

A variety of solid state imaging devices each of which comprises a light receiving element having an MOS-type light receiving/accumulating portion, are well-known in the prior art. Among these there is a solid state imaging device of a type which uses a light receiving element having the MOS-type light receiving-/accumulating portion, as well as having an internal amplifying function. The solid state imaging device of this type is exemplified by an imaging device which uses a CMD (Charge Modulation Device) suggested by the inventor of the present invention. The contents of the above-described imaging device were disclosed in Japanese Patent Laid-Open No. 61-84059 and a thesis entitled "A new MOS Image Sensor Operating in a Non-Destructive Readout Mode", p.p. 353 to 356, collected preliminary theses of International Electron Device Meeting (IEDM) held in 1986.

FIG. 1 illustrates a cross sectional structure of one pixel of the conventional CMD solid state imaging device. Referring to FIG. 1, reference numeral 101 represents a p⁻ Si substrate, 102 represents a channel layer composed of an n⁻ epitaxial layer, 103 represents n⁺ source (drain) layer, 104 represents n⁺ drain (source) layer, 105 represents an $SiO_2$ gate insulating film, 106 represents an annular gate electrode and 107 represents a protection film (passivation film) made of insulating material.

The light receiving operation performed by the CMD light receiving device structured as described above will now be described. When light 108 is made incident upon the upper portion of the gate electrode 106, incidental light 108 passes through the protection film 107, the gate electrode 106 and the gate insulating film 105 before it is introduced into the channel layer 102. As a result, hole-electron pairs are generated in the channel layer 102. Light generating holes of the above-described hole-electron pairs are accumulated in the interface between the gate insulating film 105 formed below the gate electrode 106 and the channel layer 102, the gate electrode 106 being applied with an inverse bias. As a result, the surface potential of the interface is raised. Thus, the potential barrier acting against the electrons present between the source layer 103 and the drain layer 104 is lowered. Thus, an electron current passes through the n⁻ channel layer 102. By reading the above-described electron current, an optical signal, which has been amplified, can be obtained.

There is a new technology relating to the imaging device such as a CCD, which has been put into practical use, in which the aperture factor is improved by means of a microlens array accumulated on the imaging device by using a resin. For example, Japanese Patent Laid-Open No. 1-309370 discloses such a structure arranged as shown in FIG. 2. That is, the solid state imaging device disclosed above includes a light receiving portion comprising n⁺ photodiode regions 202 forming a multiplicity of photoelectrical conversion elements formed on a p-type Si substrate 201, n-type buried channels 203, p⁺ type channel stoppers 204, transfer electrodes 205, via an interlayer film 206, disposed at the positions except for the positions which correspond to the n⁺ photodiode regions 202 and aluminum light insulating films 207 disposed on the interlayer film 206 at positions which correspond to the transfer electrodes 205. The solid state imaging device further includes transparent intermediate layers 208-1, 208-2, 208-3 and 208-4 which cover the light receiving portion and each of which has a flat surface, and a convex lens comprising transparent photosensitive resin layers 213 selectively formed on the above-described intermediate layers 208-1, 208-2, 208-3 and 208-4 at positions to correspond to the n⁺ photodiode regions 202 and another transparent intermediate layer 208-5 for covering the surfaces of the transparent photosensitive resin layers 213. The above-described intermediate layers 208-1 to 208-5 are made of PGMA, while each of the transparent photosensitive resin layers 213 is made of gelatin. Referring to FIG. 2, reference numerals 209, 210 and 211 respectively represent magenta, cyan and yellow coloring layers formed on the intermediate layers 208-1, 208-2 and 208-3.

In the imaging device thus-constituted, each of the intermediate layers 208-1 to 208-5 and the transparent photosensitive resin layers 213 has a refractive index of 1.5 which is substantially the same as that of each of the coloring layers 209, 210 and 211. Assuming that light is made perpendicularly incident upon the convex lens and, assuming that the thickness of the intermediate layer is $t_1$ and that of the convex lens is $t_2$ as shown in FIG. 3, an aperture factor which approximates to 100% is realized if the following equation is satisfied:

$$t_1 = n_1/(n_1-n_0) \cdot (p_2 + t_2^2)/2t_2 - t_2$$

where $n_0$ and $n_1$ respectively are the refractive index of air and that of the intermediate layer and symbol p is the half of the pitch of cells in the horizontal direction.

That is, by forming a microlens having a thickness of t1 on the light receiving portion, according to the above-described equation, with respect to the pitch p, incidental beams can be diaphragmed onto substantially one point on the surface of the light receiving portion. Furthermore, in a structure in which the focal point is positioned in the light receiving region, a high aperture factor of about 80% can be realized.

The sensitivity can, to a certain degree, be improved in comparison to the conventional solid state imaging device by arranging the structure in such a manner that the amplifying type light receiving element is used in the pixel portion of the solid state imaging device and the microlens is disposed on the light receiving portion. However, a solid state imaging device capable of realizing further improved sensitivity is also desired.

SUMMARY OF THE INVENTION

An object of the present invention is to provide a solid state imaging device having a conventional microlens capable of realizing a high sensitivity.

In order to achieve the above-described object, according to one aspect of the present invention, there is provided a solid state imaging device having a pixel array in which a multiplicity of pixels, which include at least a light receiving portion and an accumulating portion, are arranged, the solid state imaging device comprising: a protection film applied on the pixel array and transparent with respect to visible light; and microlens arrays selectively disposed on the protection film correspondingly to each of the light receiving pixels and made of organic or inorganic material, wherein each of the microlens arrays is formed in such a manner that its optical axis and the focal point are present in a high electric field applied region in the light receiving portion and the accumulating portion of each of the pixels.

As a result of the arrangement of the structure in which the optical axis and the focal point of the microlens array are present in a high electric field applied region in each of the pixels, photocarriers generated in the light receiving portion due to light beams converged by high aperture factor are avalanche multiplied in a high electric field and thereby the light generating carriers can be amplified before they are accumulated. Consequently, a high sensitive solid state imaging device can be realized.

Other and further objects, features and advantages of the invention will be appear more fully from the following description.

BRIEF DESCRIPTION OF THE DRAWINGS

FIGS. 20A to 20E illustrate the plan and cross sectional structures of the CMD according to a sixth embodiment of the present invention;

DESCRIPTION OF THE PREFERRED EMBODIMENT

Preferred embodiments of the present invention will now be described. First, the avalanche phenomenon, which can be observed in a CMD light receiving element for use in embodiments of a solid state imaging device according to the present invention, and the result of an investigation made about an avalanche multiplying mechanism will now be described.

Figure 4:
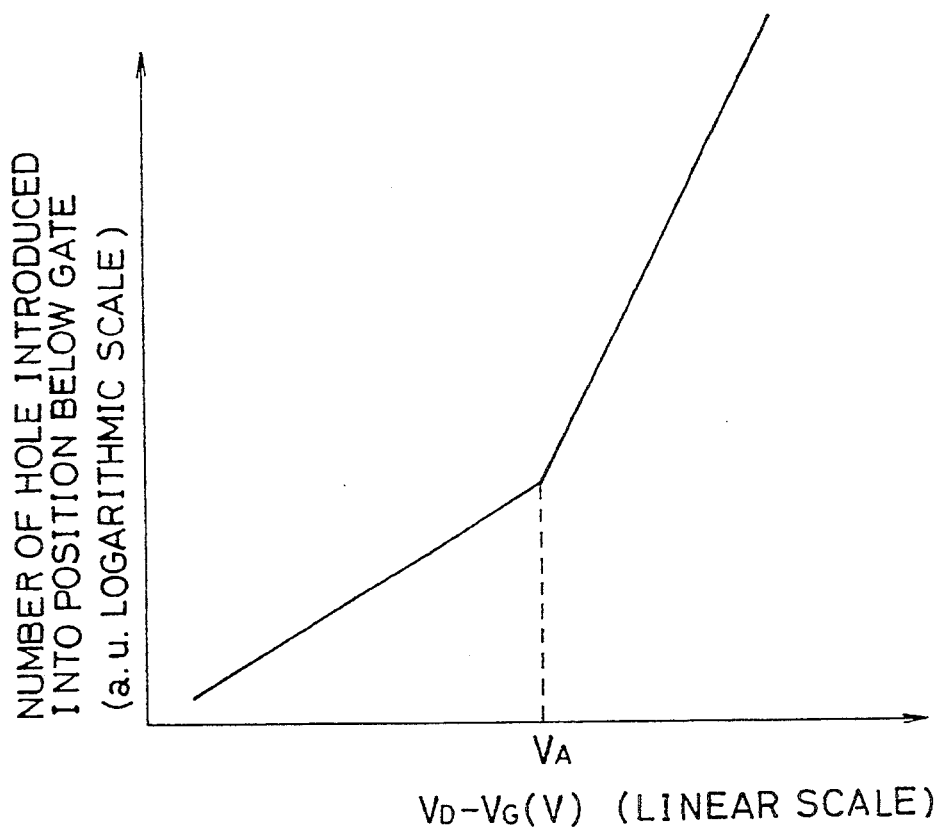
FIG. 4 is a graph which illustrates the relationship between the number of positive holes to be introduced into the Si/SiO$_2$ interface below the gate electrode of a CMD and potential difference ($V_D-V_G$) between the gate electrode and the drain terminal.

FIG. 4 is a graph which illustrates the relationship between the number of the positive holes (pieces/sec) introduced into the interface between the gate insulating film (SiO$_2$) and the epitaxial layer (Si) formed below the gate electrode of the CMD and the potential ($V_D-V_G$) between the gate electrode and the drain terminal, wherein the axis of the ordinate stands for the logarithmic scale and the axis of the abscissa stands for the linear scale. As can be clearly seen from this graph, the number of the positive holes, which will be introduced into the position below the gate electrode, rapidly increases when the difference between the potential of the drain and that of the gate is larger than $V_A$.

Then, the activation energy of the number of the positive holes introduced into the position below the gate electrode was measured. As a result, an activation energy level of 0.67 eV or lower was displayed in a region which holds the relationship $|V_D-V_G|<|V_A|$ while that of 0.50 eV or lower was displayed in a region which holds the relationship $|V_D-V_G|>|V_A|$. Therefore, it was found that the rapid increase in the introduced positive holes which takes place in the region which holds the relationship $|V_D-V_G|>|V_A|$ was not due to the tunneling current but was due to the avalanche effect. As is generally known, the tunneling current has an activation energy of a level of 0.1 eV or lower.

Figure 5:
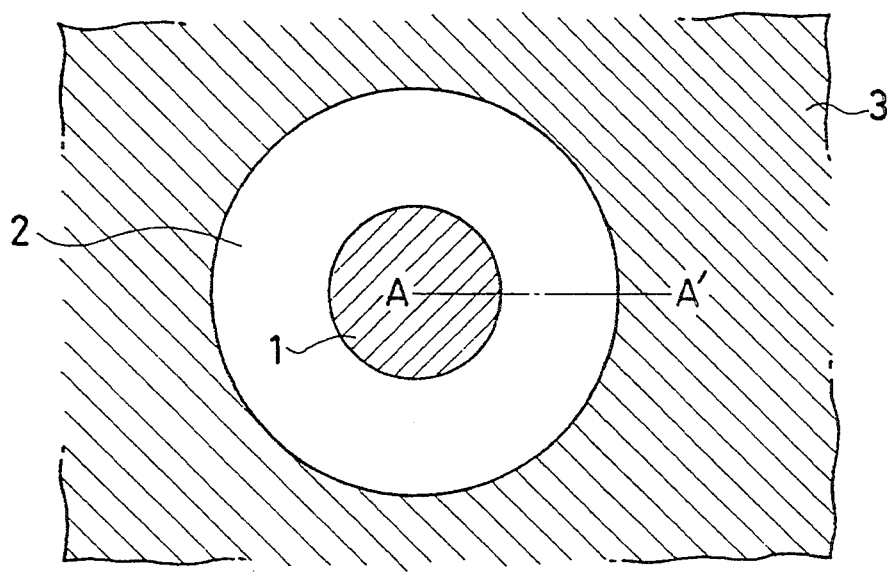
FIG. 5 is a schematic view which illustrate the plane of the CMD.
Figure 6:
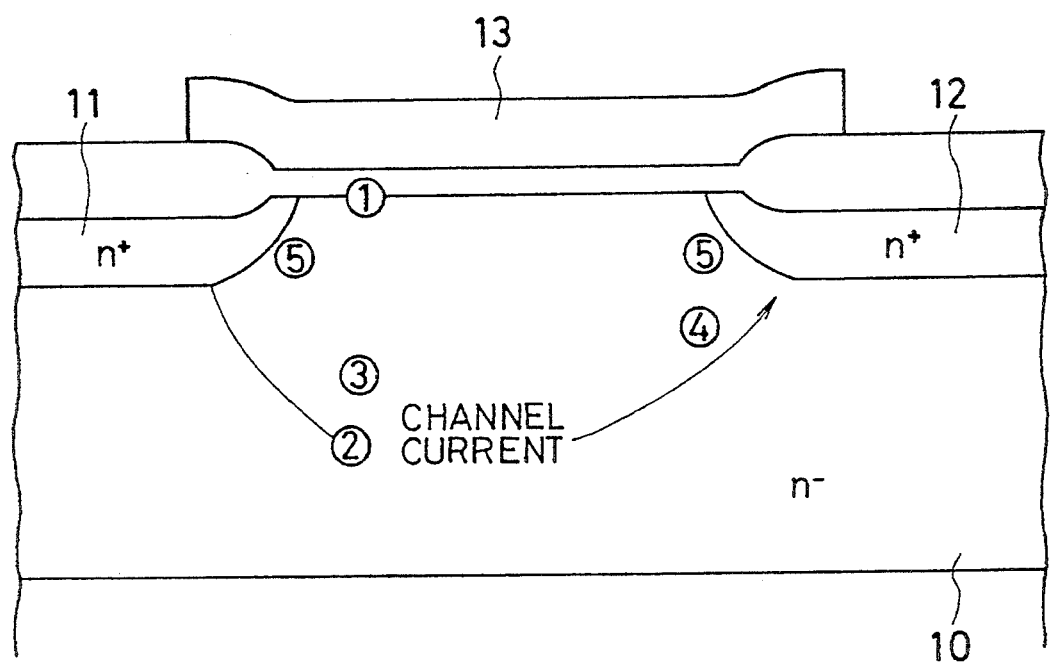
FIG. 6 is a cross sectional view taken along line A-A' of FIG. 5.

Then, the portion in which the avalanche phenomenon takes place was researched. FIG. 5 is a plan view which illustrates the n-channel CMD, in which reference numeral 1 represents a source region, 2 represents a gate electrode portion and 3 represents a drain region. A cross sectional view taken along line A-A' of FIG. 5 is shown in FIG. 6. Referring to FIG. 6, reference numeral 10 represents an n− epitaxial layer, 11 represents an n+ source diffusion layer, 12 represents an n+ drain diffusion layer and 13 represents a gate electrode. As shown in FIG. 6, the following five prospective regions can be enumerated as the most suitable region in which the avalanche multiplication of the positive hole is generated: (1) the interface region ①  between the Si layer and the SiO$_2$ layer at a position below the gate electrode, (2) the avalanche-multiplied region ② due to the channel current, (3) the bulk region ③ in the n− epitaxial layer, (4) the bulk junction region ④ and (5) the gate-drain interface region ⑤ and the gate-source interface region ⑤.

First, the relationship between the number of the generated holes and the gate potential was examined by using an MOS diode. As a result, a discrimination was made that the above-described region ① the interface region between the Si layer and the SiO$_2$ layer at a position below the gate electrode was not the region in which the avalanche phenomenon was generated. Furthermore, the substrate potential of the CMD was then changed to significantly change the channel current passing between the source and the drain, and the volume of the bulk region. However, the number of the introduced positive holes was not changed. As a result, a discrimination was made that the above-described regions ② the avalanche-multiplied region due to the channel current and ③ the bulk region in the n− epitaxial layer were not the regions in which the avalanche phenomenon was generated.

Then, the dark current passing through a PN diode formed from an n+ drain diffusion layer/n− epitaxial layer/p-substrate structure was measured. As a result, a discrimination was made that the region ④ the bulk junction region was not the region in which the avalanche phenomenon was generated. As a result of the above-described experiments, a discrimination was, in a manner of the elimination by comparison, made that the avalanche phenomenon was generated in the region ⑤ shown in FIG. 6 which is the gate-drain interface region and the gate-source interface region.

Figure 7:
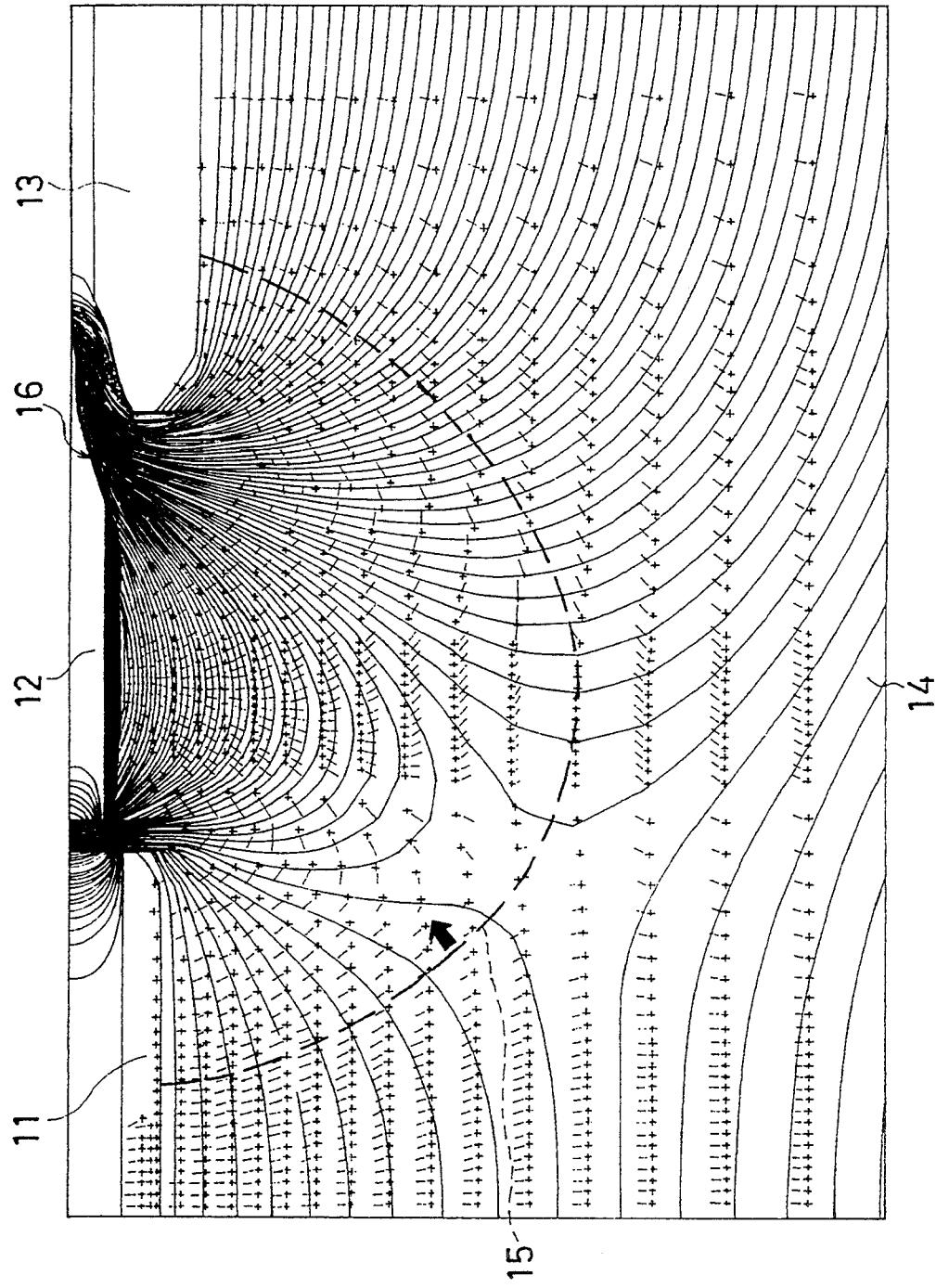
FIG. 7 illustrates the results of calculations of the potential distribution and the positive hole current density of the CMD.

Then, the potential distribution in the CMD when it receives light was examined by using a device simulator. FIG. 7 illustrates the equipotential lines and the positive hole current vectors obtained as a result of calculations made about the potential distribution in the CMD and the density of the hole current when the CMD receives light. The positive hole current is a component which is generated due to a thermal production. Referring to FIG. 7, reference numeral 11 represents a source diffusion layer, 12 represents a gate electrode, 13 represents a drain diffusion layer and 14 represents a substrate. As can be clearly seen from the positive hole current density vector, the portion above a line 15, that is, the saddle point of the potential and a route through which the electron current passes through, that is, the portion which is more adjacent to the surface of the potential ridge line, is the light receiving region of the CMD. Also, the highest density of the equipotential lines is displayed in the gate-drain interface region 16, that is, the strongest electric field is created in the same portion in the CMD at the time of receiving light.

Figure 8:
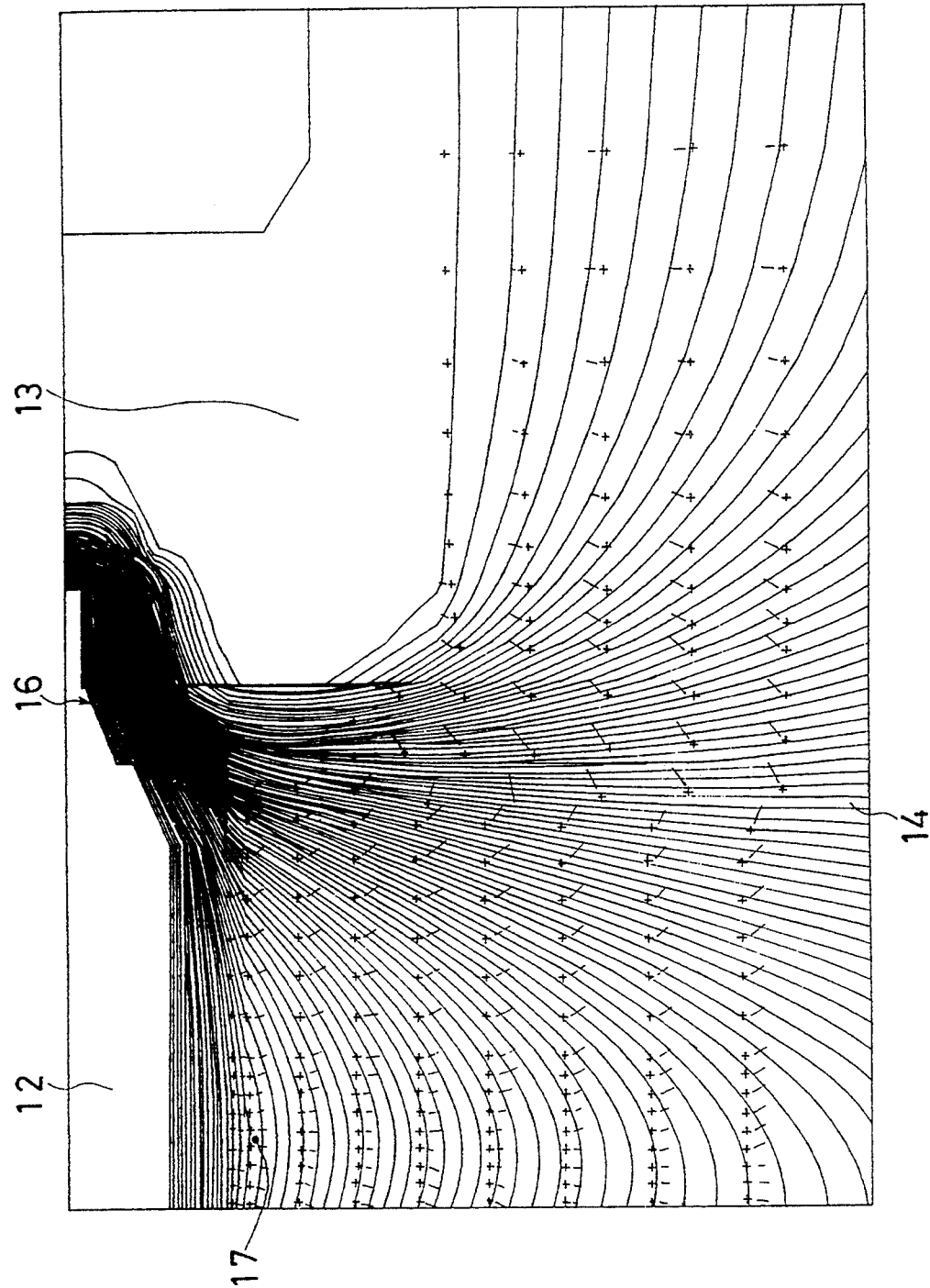
FIG. 8 is an enlarged view which illustrates a portion of FIG. 7.

FIG. 8 is an enlarged view which illustrates the gate-drain interface region 16 shown in FIG. 7. Referring to FIG. 8, reference numeral 12 represents a gate electrode, 13 represents a drain diffusion layer and 14 represents a substrate. Similarly to FIG. 7, the equipotential lines and positive hole current vectors are illustrated in FIG. 8. As can be clearly seen from FIG. 8, the positive holes generated in the vicinity of the gate-drain interface region 16 are first moved to the interface between the gate insulating film and the semiconductor substrate. The positive holes which have reached the interface are, along the interface, moved to a positive hole accumulating region 17 present in the central portion of the gate electrode 12.

Figure 9:
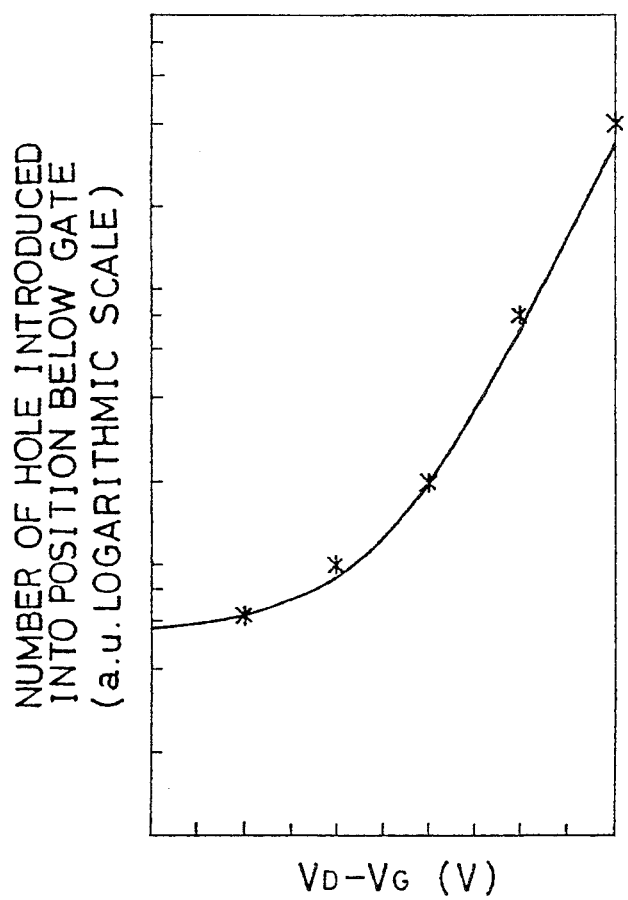
FIG. 9 is a graph which illustrates the calculated values and the experimental values of the relationship between the number of positive holes introduced into the gate of the CMD and the potential difference between the gate electrode and the drain terminal.

As a result of the above-described graph drawing, the relationship between the number of the positive holes introduced into the gate and the drain-gate potential (electric field) was calculated to subject it to a comparison made with the result of the experiment. The result of this comparison is shown in FIG. 9. Referring to FIG. 9, the axis of abscissa stands for $V_D-V_G$ (V), that is, the voltage to be applied to a position between the drain and the gate, the voltage being shown in a linear scale. On the other hand, the axis of ordinates stands for the number (pieces/sec) of the positive holes introduced into the gate in a logarithmic scale. A continuous line stands for the results of the calculations and marks * denote the results of the measurements. As can be seen from FIG. 9, the results of the analyzing calculations and the measured results significantly coincide with one another. Furthermore, the temperature characteristics were evaluated, resulting a fact to be confirmed that the results of the calculations significantly coincide with the results of the measurements. As a result, the model (FIG. 7 and 8) according to the simulator satisfactorily reproduce the results of the experiments and thereby the validity of the simulation model was confirmed.

Furthermore, the P-channel CMD was measured, resulting in the fact that the number of electrons introduced into the gate is larger than the number of the positive hole of the N-channel CMD by 10 times or more. This means a fact that is consistent with conventional data which shows that the surface impact ionization factor of an electron is larger than that of the positive hole by 10 times or more. Therefore, the validity of the above-described model was further confirmed.

Figure 10:
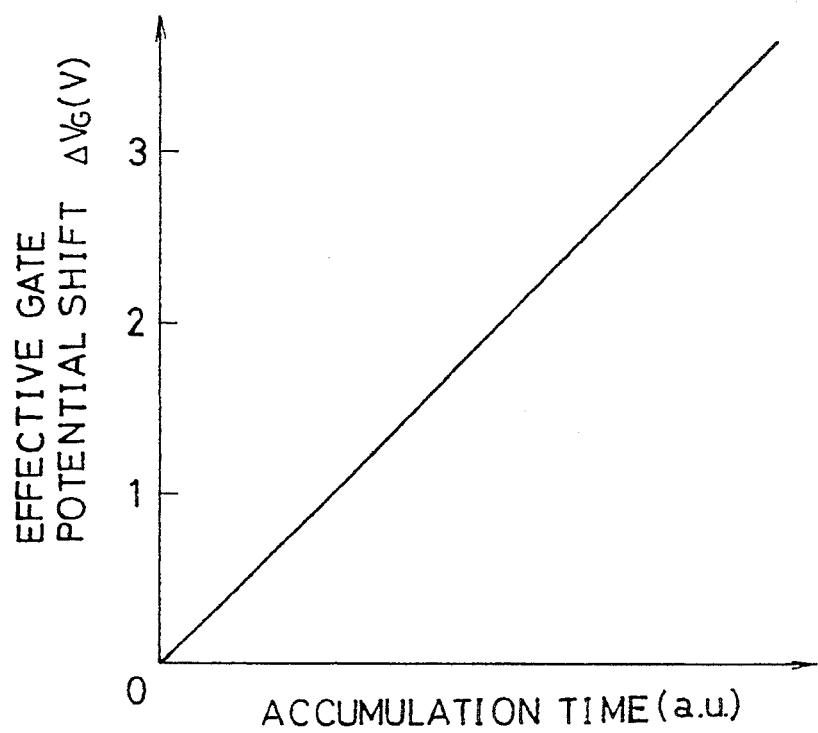
FIG. 10 is a graph which illustrates the relationship between the accumulation time in the CMD and the quantity of the effective gate potential shift.

Finally, a fact whether or not the avalanche multiplying factor is changed due to the carrier number accumulated in a portion below the gate was examined. FIG. 10 illustrates the relationship between the shift amount $\Delta V_G$ of the effective gate potential obtained by conversion of the source current of the CMD under a condition $|V_D-V_G| > |V_A|$ and a lapse of time of the accumulative state. Both of the two axes are shown as linear scales. As can be understood from FIG. 10, the relationship between the accumulation time and the shift amount $\Delta V_G$ of the effective gate potential holds a good linear relationship in a range in which $\Delta V_G$ is larger than 3V. Since the maximum shift amount $\Delta V_G$ of the gate potential due to the accumulative positive hole generated in an ordinary light receiving accumulation operation is about a value smaller than 1V, it can be understood from FIG. 10 that the avalanche multiplying factor may be made to be a constant value in a range of the light receiving accumulation operation performed by the CMD.

Figure 11:
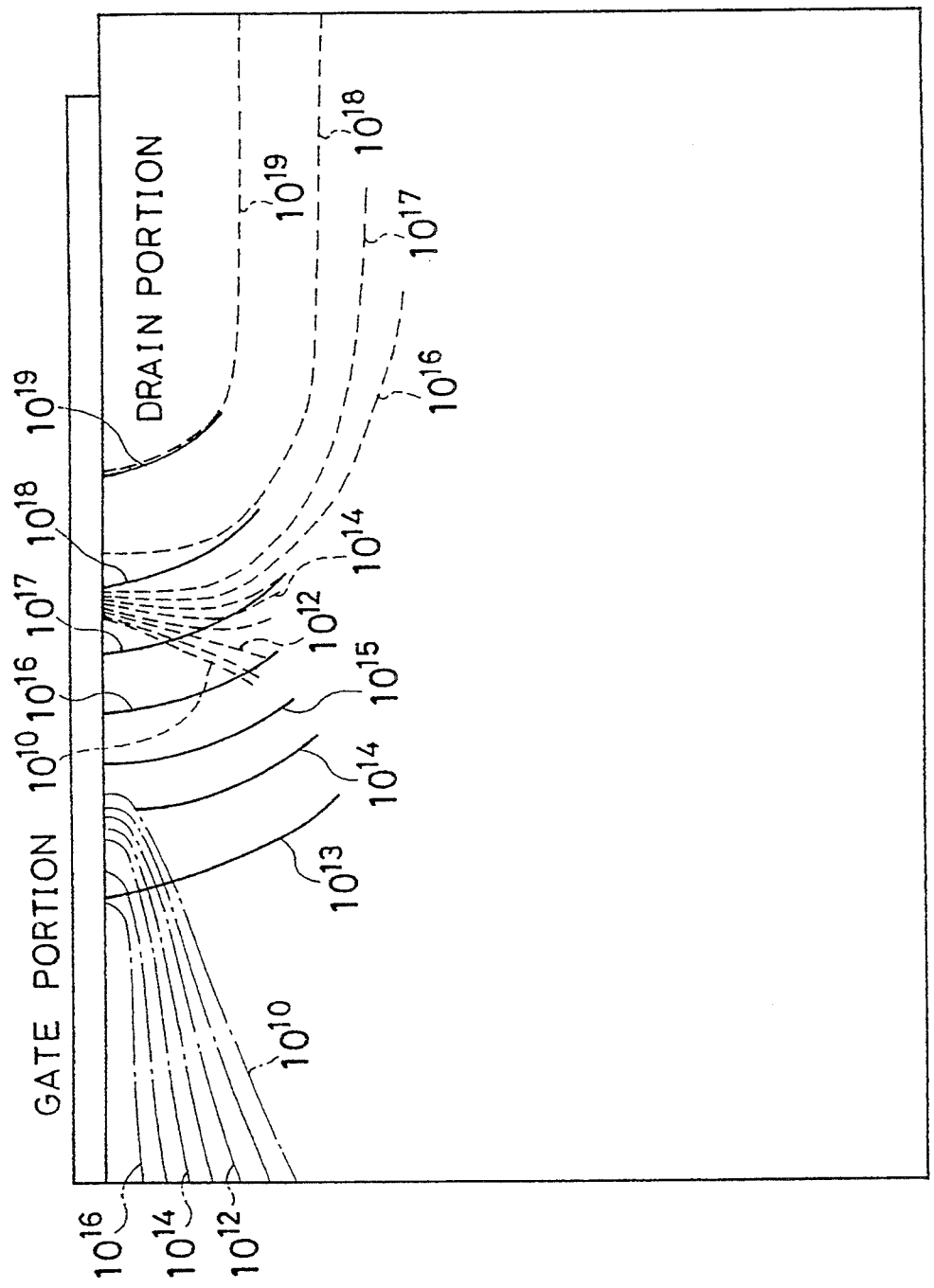
FIG. 11 illustrates the distribution states of the positive holes, electrons and the donor density in the vicinity of the gate-drain interface when the saturated number of positive holes are accumulated below the gate electrode of the CMD.

FIG. 11 illustrates a state of distribution of each density of the positive holes, electrons and donors in a vicinity of the gate-drain interface when the saturated number of positive holes is accumulated in a portion below the CMD gate electrode. Continuous line, dashed lines and alternate long and short dash lines respectively correspond to the density of the donor, the density of electrons and the density of the positive holes. As can be seen from FIG. 11, a fact can be understood that the positive holes are present deviated from the drain portion but the same are present in the central portion of the gate portion. Another fact can be understood that regions in the drain region portion in which the donor density is lower than $10^{18}$ cm$^{-3}$ are depleted. That is, even if the positive holes are accumulated in a portion below the gate electrode, the gate-drain interface is brought into the depleted region in which neither positive holes nor electrons are present due to the bias applied to a portion between the gate and the drain. Furthermore, the potential distribution at the gate-drain interface was compared between a case in which the positive holes are present and a case in which the same is not present. As a result, there was no difference in the potential distribution, that is, the electric field distribution.

Because of the above-described reasons, a fact can be understood that, in a CMD, the avalanche multiplying factor becomes a constant value during the accumulation of the carrier. That is, when light is made incident upon the CMD, the photocarrier generated due to incidental light and the number of the carriers realized due to the multiplication of the above-described photocarriers performed due to the avalanche effect and accumulated in a portion below the gate electrode hold a good linear relationship.

Figure 12:
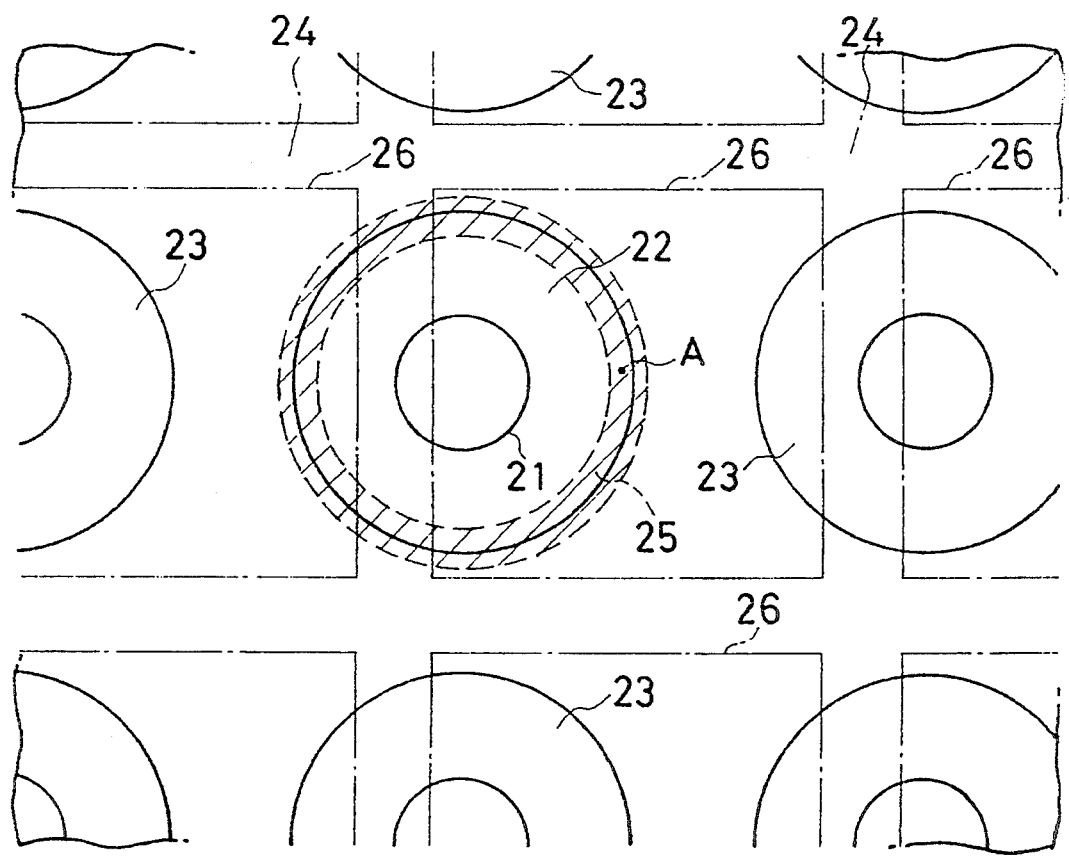
FIG. 12 is a plan view which illustrates the CMD imaging device according to a first embodiment of the solid imaging device of the present invention.

The avalanche phenomenon which will be observed in the CMD is a phenomenon of a type described above. Then, preferred embodiments of the present invention will now be described. FIG. 12 is a plan view which illustrates a CMD imaging device portion of a first embodiment of a solid state imaging device according to the present invention. Referring to FIG. 12, reference numeral 21 represents a source region (drain region), 22 represents a gate electrode portion and 23 represents gate electrode portions of pixels of adjacent position. Reference numeral 24 represents common drain (source) regions for all of the pixels and a slanting line region 25 is a region in which the avalanche phenomenon takes place. Regions 26 surrounded by alternate long and short dash lines respectively denote microlenses formed on the pixels to correspond to the pixels. Referring to FIG. 12, each of the microlenses has an optical axis and a focal point which respectively are present at point A in the region 25 of each pixel.

In the CMD imaging device constituted as described above, incidental beams gathered by the microlens 26 are effectively converged onto the surface of region A. Thus, in a semiconductor disposed under the region A, a photoelectrical conversion is taken place to generate photocarriers which are then multiplied due to the avalanche effect performed in the region 25. As a result, the multiplied photocarriers are accumulated in the insulating film-semiconductor interface present below the gate electrode portion 22.

Although the above-described first embodiment is arranged in such a manner that the gate-drain (source) interface region is made to be the avalanche multiplying region as shown in FIG. 12, the interface region between the source (drain) region 21 and the gate electrode portion 22 may be made to be the avalanche multiplying region. However, the relative position of the microlenses with respect to the positions of the pixels must, of course, be changed in this case.

Figure 13:
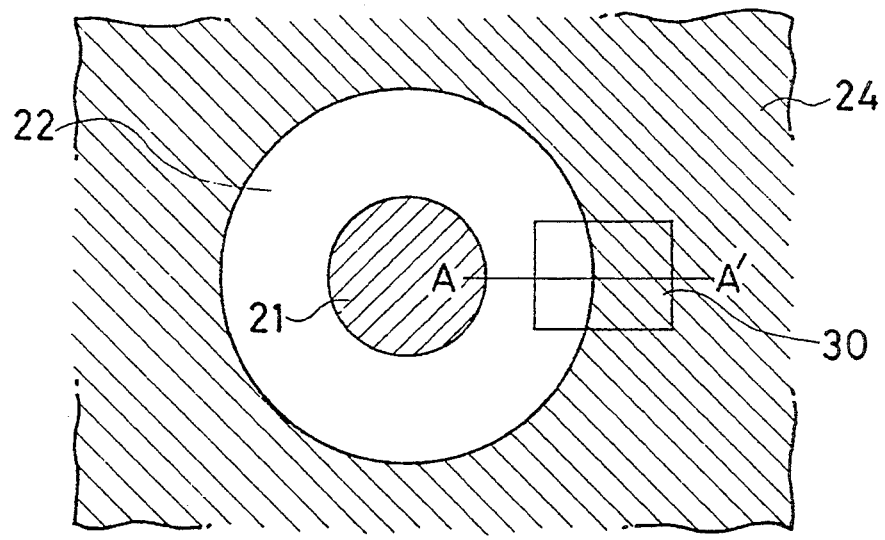
FIG. 13 is a plan structural view which illustrates the CMD.

Although the first embodiment is arranged in such a manner that the avalanche multiplying region is formed completely around the gate-drain (source) region, the present invention is not limited to this. The necessity lies in that the avalanche multiplying region is formed in only the portion which is irradiated with light. That is, it is necessary to constitute the structure of the CMD pixel, as shown in FIG. 13, having the source (drain region) 21, the gate electrode portion 22 and the drain (source) region 24 in such a manner that only a region 30, onto which incidental light beams are converged by the microlens and irradiated with the same, generates the avalanche multiplying phenomenon. In this case, the region 30 may, of course, be made to span the source region 21 and the gate electrode portion 22.

Figure 14A:
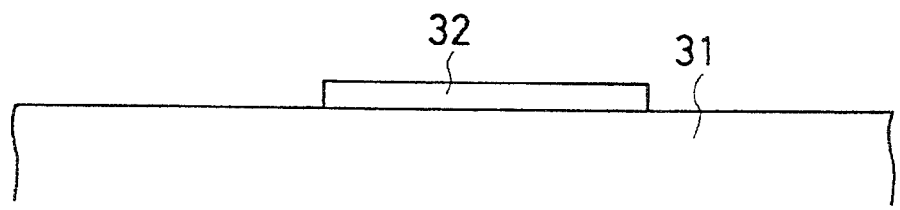
FIGS. 14A to 14D illustrate the cross sectional structure of the CMD according to a second embodiment of the present invention.

FIG. 13 is a plan view which illustrates a second embodiment of the present invention. FIGS. 14A to 14D are cross sectional views which respectively illustrate the CMD imaging device in accordance with the process flow in order to describe the cross sectional structure of the CMD imaging device according to the second embodiment. Each of FIGS. 14A to 14D is a cross sectional view taken along line A-A' of FIG. 13. Referring to FIG. 14A, reference numeral 31 represents a semiconductor substrate which is arranged in such a manner that a thin film made of $Si_3N_4$ or the like which possesses oxidation resisting characteristics is formed on the surface of the substrate 31 by the LPCVD method or the like and a thin film 32 is formed at a desired surface position, that is, at a position which corresponds to the region 30 shown in FIG. 13 by the photolithography method and the reactive ion etching method.

Thickness $t_1$ of the thin film 32 made of the $Si_3N_4$ or the like is made to be a thickness which holds the relationship $t_1/k_1 < t_2/k_2$ assuming that the relative dielectric constant of the thin film 32 is $k_1$, and the dielectric constant of a gate insulating film 33 to be described later is $k_2$ and as well as the thickness of the gate insulating film is $t_2$. For example, in a case where the thin film 32 is made of an $Si_3N_4$ film, the gate insulating film 33 is made of an $SiO_2$ film and thickness $t_2$ of the gate insulating film 33 is 35 nm, the relationship $t_1 < t_2 \cdot k_1/k_2 = 35 \times 8.0/3.9 = 72$ nm must be held, that is, thickness $t_1$ must be thinner than 72 nm.

In a case where the thin film 32 is made of the $Si_3N_4$ film and the semiconductor substrate 31 is made of silicone, there arises a risk of generation of stress in the substrate silicone which will cause a defect due to the difference in the coefficient of thermal expansion of the above-described two elements in a heat treatment process to be described later. As a measures to prevent this by relaxing the stress, a structure may be employed in which the thin film 32 is formed into an $Si_3N_4/SiO_2$ structure and as well as the $SiO_2$ film is interposed at a position immediately above the substrate 31. In this case, film thicknesses $t_1$ and $t_1'$ must be made to be values which hold the following relationship assuming that thickness of the $SiO_2$ film is $t_1'$ and the specific dielectric constant is $k_1'$:

$$t_1/k_1 + t_1'/k_1' < t_2/k_2$$

Figure 14B:
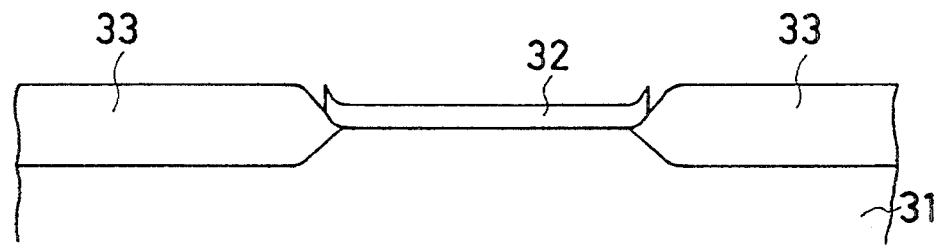
Figure 14C:
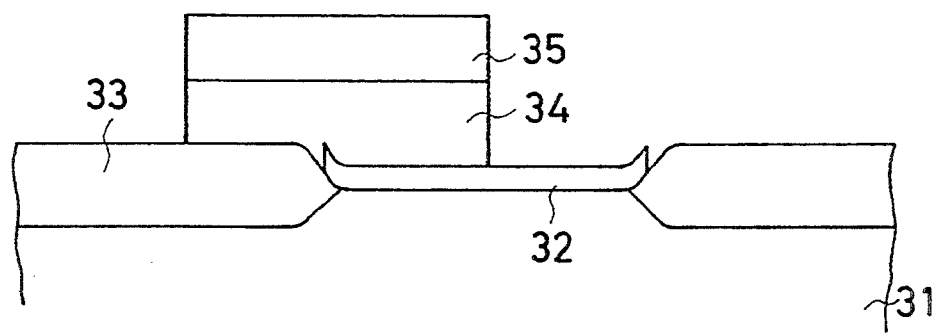

When a gate oxidizing process is performed in a state shown in FIG. 14A, a cross sectional structure shown in FIG. 14B is realized. Referring to FIG. 14B, reference numeral 33 represents a gate insulating film formed in the oxidizing process and having a thickness of about 10 to 50 nm. Then, a thin film made of polysilicone or the like is formed by the LPCVD method on the surface of the thin film 32 and the film 33. Then, a resist film 35 is, by the photolithography method, formed on only a portion above a region which is formed into the gate electrode portion. The above-described resist film 35 is used as a mask to perform etching of the thin film by the reactive ion etching method so that a gate electrode 34 is formed. After the above-described processes have been completed, a state shown in FIG. 14C is realized. Then, it is subjected to the ion injection and a heat treatment so that an n+-type source diffusion layer 36 and a drain diffusion layer 37 are formed. The resist film 35 is removed before or immediately after the ion injection process has been performed.

Figure 14D:
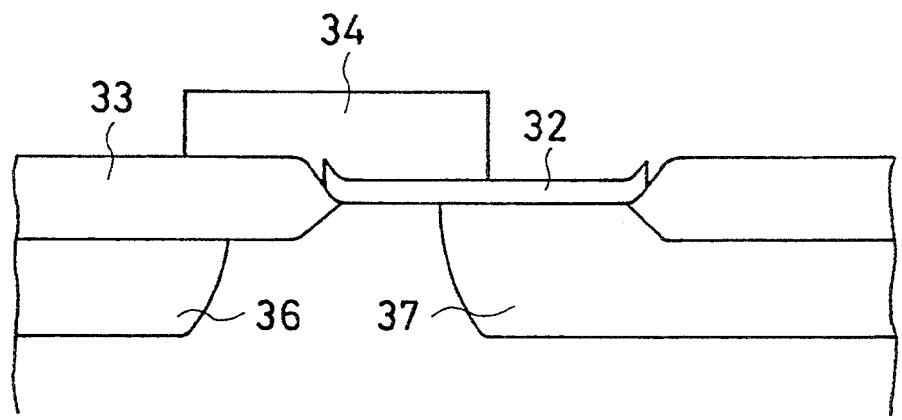

When the above-described processes have been performed, a cross sectional structure shown in FIG. 14D is realized. By employing the thus-realized cross sectional structure, the thickness of only the thin film 32 formed between the gate electrode 34 in only the region denoted by reference numeral 30 shown in FIG. 13 and the drain diffusion layer 37 is made to be thinner in comparison to the gate insulating film 33 formed in other regions. As a result, a high electric field is caused to be applied to the light gathering region 30 and thereby the multiplying accumulation of the photocarriers can effectively achieved by the avalanche effect. On the other hand, the regions which correspond to the portions except for the portion denoted by reference numeral 30 shown in FIG. 13 display a relatively lower electric field in comparison to the region which corresponds to the region 30. Therefore, the dark current which serves as a source of generating noise and the multiplication of the dark current are prevented but only the photocarriers are effectively multiplied. Consequently, a CMD light receiving device exhibiting a high S/N ratio can be realized.

Figure 15A:
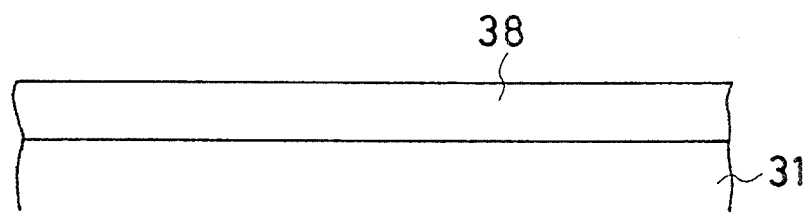
FIGS. 15A to 15D illustrate the cross sectional structure of the CMD according to a third embodiment of the present invention.
Figure 15B:
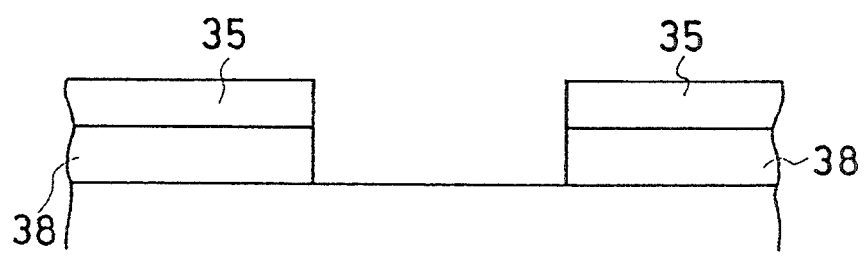
Figure 15C:
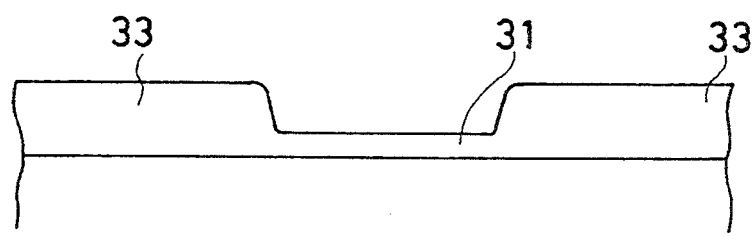
Figure 15D:
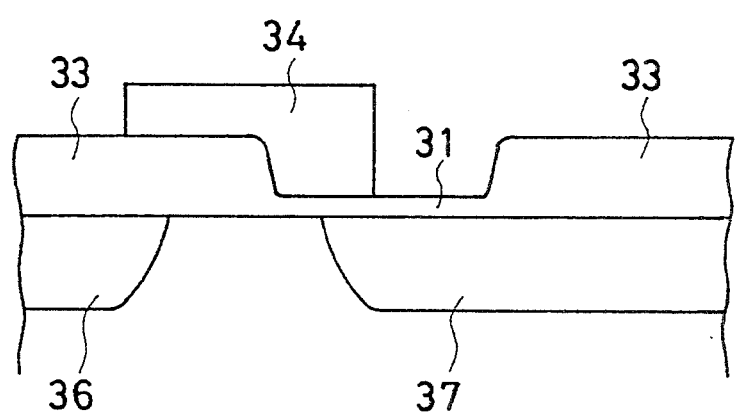

The arrangement in which the thickness of the gate insulating film is thinned in only the light gathering region can be realized by another method. Then, a third embodiment in which the above-described structure is realized will now be described. FIGS. 15A to 15 are cross sectional structural views which illustrates the manufacturing process according to the third embodiment of the present invention. The same or equivalent elements as those shown in FIGS. 14A to 14D are given the same reference numerals. Referring to FIG. 15A, reference numeral 31 represents a semiconductor substrate having an insulating film 38 formed on the surface thereof by a thermal oxidation method or the like. The thickness of the insulating film 38 is made to be thinner than the thickness of the gate insulating film measured when the final manufacturing process has been completed. Then, in order to open only the light gathering region which corresponds to the region 30 shown in FIG. 13, the resist film 35 is formed by the photolithography method. Then, the above-described resist film 35 is used as a mask as shown in FIG. 15 to remove the insulating film 38 in the opening portion. Then, the resist film 35 is removed before the additional gate oxidation process is performed. As a result, the gate insulating film 33 and the insulating film 31 having a desired thickness which is thinner than that of the gate insulating film 33 are formed as shown in FIG. 15C. Then, by performing similar processes to those according to the second embodiment shown in FIGS. 14A to 14D, the gate electrode 34, the source diffusion layer 36 and the drain diffusion layer 37 are formed as shown in FIG. 15D.

Figure 16A:
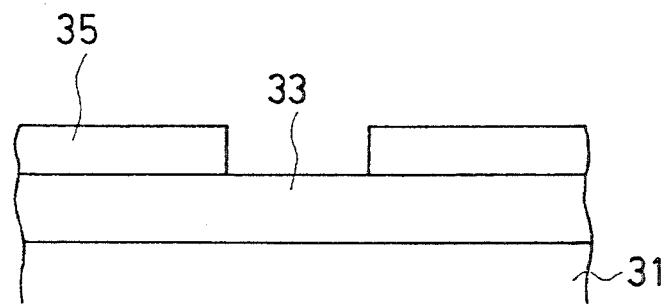
FIGS. 16A and 16B are cross sectional views which illustrate modification to the third embodiment of the present invention.
Figure 16B:
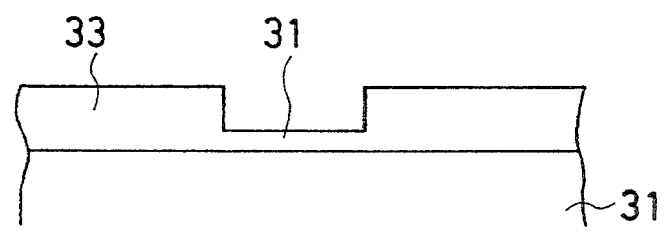

Also by the above-described manufacturing process, the thickness of the gate insulating film in the light gathering portion can be thinned in comparison to that of the gate insulating film in the other portions. The structure realized by the method according to this embodiment can be realized by another process as shown in FIGS. 16A and 16B as a modification process. Referring to FIG. 16A, reference numeral 31 represents the semiconductor substrate having, on the surface thereof, the gate insulating film 33 by the heat oxidation method or the like. The thickness of the insulating film 33 is made to the thickness of the thickness of the manufactured gate insulating film. Then, the resist film 35 is, by the photolithography method, formed on the surface of regions except for the region which corresponds to the region 30 shown in FIG. 13. Then, the resist film 35 is used as a mask to partially remove the insulating film 33 in a region which corresponds to the region 30 by the etching method so that the insulating film 31 of the thickness of which is thinner than that of the gate insulating film 33 is formed as shown in FIG. 16B. The cross sectional structure thus-formed is the same as that according to the second embodiment shown in FIG. 14B and the state shown in FIG. 16B can be brought into the structure shown in FIG. 15D by the similar process to that according to the third embodiment.

The above-described second and third embodiments are structured in such a manner that the space between the gate electrode and the drain (source) diffusion layer in the light gathering region which corresponds to the region 30 shown in FIG. 13 is, before the gate electrode is formed, made to be reduced.

In the semiconductor process, a so-called polysilicone oxidation process in which the gate electrode is oxidized after the gate electrode has been formed is frequently employed. The reason for this lies to prevent the undesirable injection of impurities into the semiconductor substrate positioned below the gate electrode in the ensuing ion implantation process to be performed for the purpose of forming the source . drain diffusion layer. The above-described process will now be described with reference to FIGS. 17A and 17B.

Figure 17A:
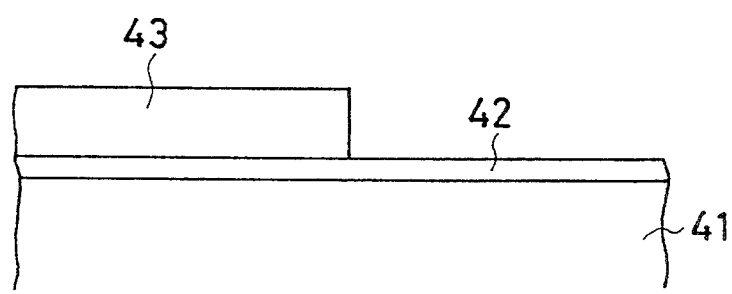
FIGS. 17A and 17B are cross sectional views which illustrate a polysilicone oxidation process for oxidizing the gate electrode after the gate electrode has been formed.
Figure 17B:
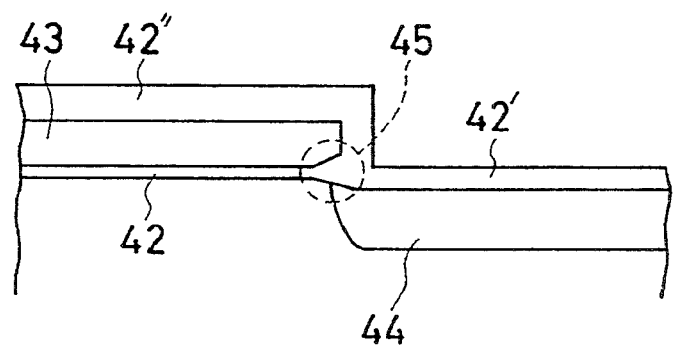

Referring to FIG. 17A, reference numeral 41 represents a semiconductor substrate, 42 represents a gate insulating film and 43 represents a gate electrode. In the state as shown in FIG. 17A, the polysilicone oxidizing process is performed before impurities are injected by the ion implantation method. Then, annealing and diffusion are performed by the heat diffusion method so that a cross sectional structure shown in FIG. 17B is realized. Referring to the drawings, reference numeral 44 represents a source (drain) diffusion layer, 42' represents a thermally oxidized film formed on the surface of the semiconductor at a position other than the gate electrode and 42" represents an oxidized film formed on the gate electrode 43. Referring to FIG. 17B, a portion 45 surrounded by dashed lines is a gate bird's beak portion with which the electric field present between the gate electrode 43 and the source (drain) diffusion layer 44 is weakened.

Figure 18A:
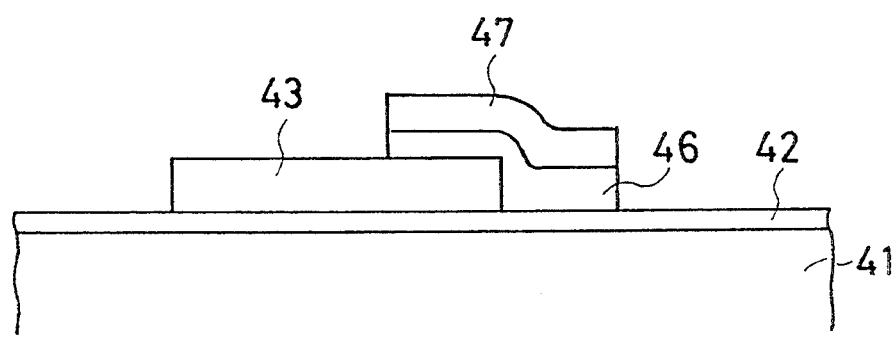
FIGS. 18A and 18B illustrate the cross sectional structures of the CMD according to a fourth embodiment of the present invention.
Figure 18B:
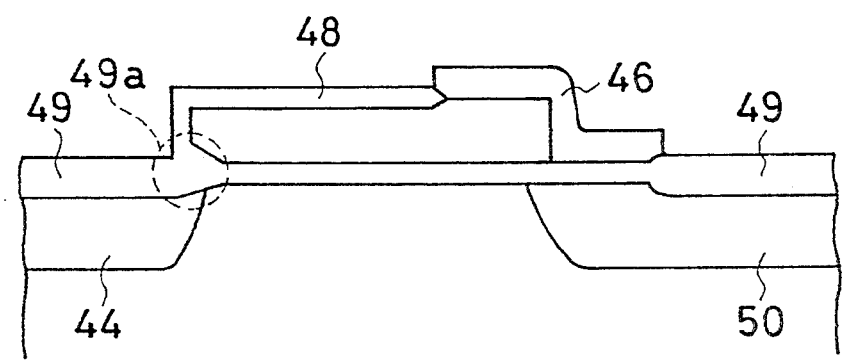

The structure and a process according to a fourth embodiment is arranged to prevent the formation of the bird's beak in only the light gathering portion 30 shown in FIG. 30. FIGS. 18A and 18B are cross sectional views which illustrate the manufacturing process according to the fourth embodiment of the present invention. Referring to FIG. 18A, reference numeral 41 represents a semiconductor substrate, 42 represents a gate insulating film and 43 represents a gate electrode. Since the structure and the manufacturing process to this point are the same as those shown in FIG. 17A, their descriptions are omitted here. Then, a film 46 made of $Si_3N_4$ or the like possessing oxidation resisting characteristics is, by the LPCVD method or the like, deposited on the surface of the wafer. Then, a resist film 47 is formed on only the region which corresponds to the region 30 shown in FIG. 13 by the photolithography process. The above-described resist film 47 is used as a mask to selectively remove the oxidation resisting film 46 by the reactive ion etching method. As a result of the process performed to this point, a cross sectional structure shown in FIG. 18A is realized.

Then, the resist film 47 is removed before the polysilicone oxidation process is performed so that an oxidized film 48 is formed on the gate electrode 43 in the portion from which the film 46 having the oxidation resisting characteristics has been removed. Furthermore, an insulating film 49 and a bird's beak 49a are formed in the portion on the surface of the semiconductor in which the film 46 having the oxidation resisting characteristics is not formed. On the other hand, in a region covered by the film 46 having the oxidation resisting characteristics, the oxidation does not proceed and as well as no gate bird's beak is formed as it is. Then, a source (drain) diffusion layer 44 and a drain (source) diffusion layer 50 are formed by the ion implantation method and the thermal diffusion method so that a structure shown in FIG. 18B is formed. In the ion implantation process to be performed for the purpose of forming the drain portion, accelerating energy is set in such a manner that ions are able to pass through the oxidation resisting film 46.

In the structure according to the fourth embodiment, no bird's beak is formed in only the region in which light gathered by the microlens is converted into an electric signal and thereby the above-described region displays a high electric field and as well as the other regions display a low electric field due to the presence of the gate bird's beak. Therefore, an effect similar to that obtainable from the second embodiment can be obtained. Although this embodiment is arranged in such a manner that the oxidation resisting thin film 46 is formed by a single-layer film structure made of, for example, $Si_3N_4$, the above-described thin film 46 may be, similarly to the second embodiment, formed into a double-layer film structure in which a film such as the $SiO_2$ thin film capable of relaxing the stress is formed below the film having the oxidation resisting characteristics.

Figure 19A:
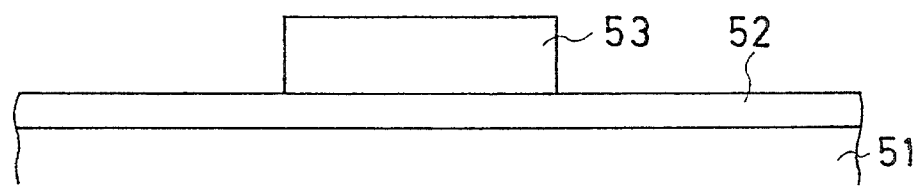
FIGS. 19A to 19E illustrate the cross sectional structures of the CMD according to a fifth embodiment of the present invention.
Figure 19B:
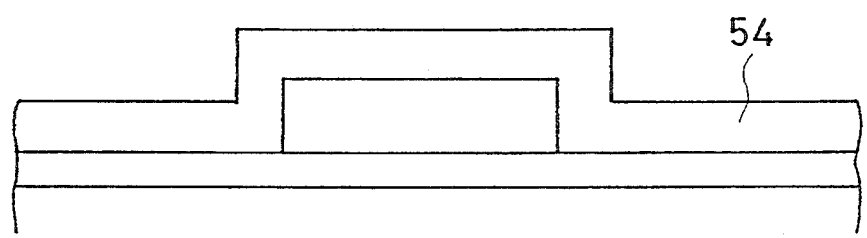
Figure 19C:
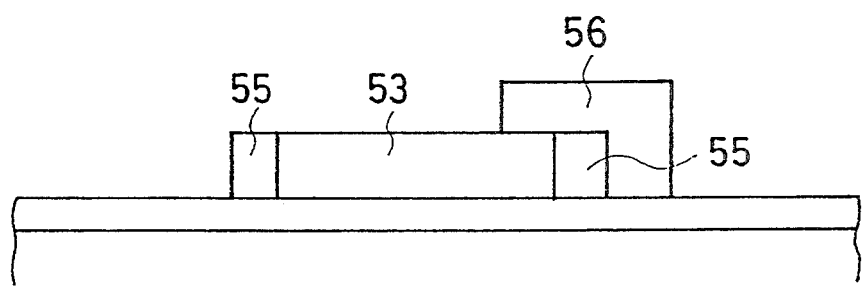
Figure 19D:
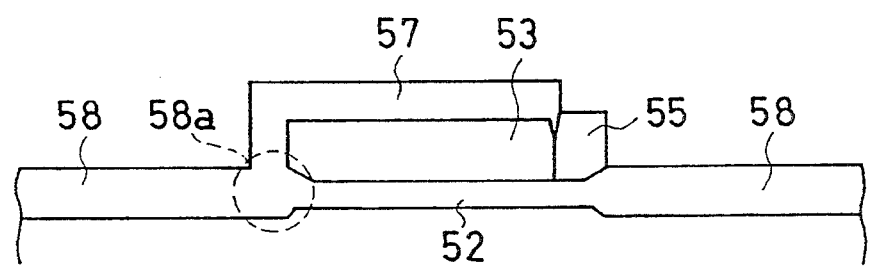
Figure 19E:
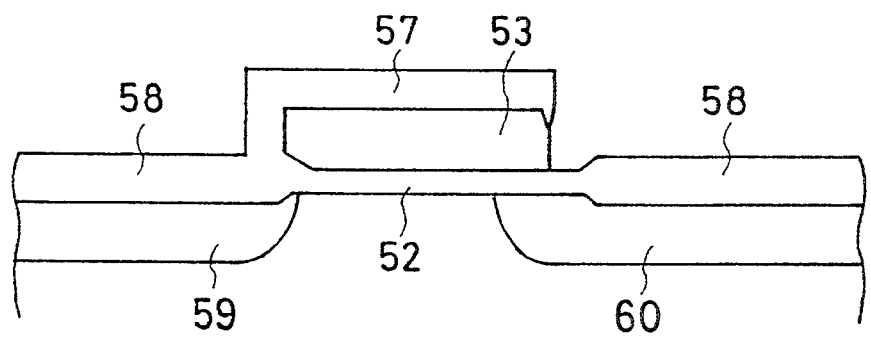

Another structure for preventing generation of the gate bird's beak may be employed as arranged according to a fifth embodiment of the present invention. FIGS. 19A to 19E are cross sectional views which illustrates manufacturing processes according to the fifth embodiment. As shown in FIG. 19A, reference numeral 51 represents a semiconductor substrate, 52 represents a gate insulating film and 53 represents a gate electrode. Then, as shown in FIG. 19B, a thin film 54 such as $Si_3N_4$ having oxidation resisting characteristics is formed on the surface of the wafer by the LPCVD method or the like. Then, an etch back process is performed by the reactive ion etching method or the like so that a side wall 55 of the thin film 54 is formed only on the side wall of the gate electrode 53. Then, a resist film 56 is formed by the photolithography method to cover only the region which corresponds to the region 30 shown in FIG. 13 as shown in FIG. 19C. Then, the resist film 56 is used to a mask so as to remove the side wall 55 formed in the region except for the region which corresponds to the region 30 shown in FIG. 13 by wet etching or isotropic dry etching. Then, the polysilicone oxidation process is performed in this state so that a structure shown in FIG. 19D is realized. Referring to the drawings, reference numeral 57 represents a polysilicone oxidized film formed on the polysilicone electrode and 58 represents an insulating film formed on the surface of the semiconductor. Reference numeral 58a represents a gate bird's beak formed in the interface between a region in which the source will be made and the gate electrode 53. Then, the side wall 55 is removed by the wet etching method or the like after the polysilicone oxidation has been completed. Then, a source (drain) diffusion layer 59 and a drain (source) diffusion layer 60 are formed as shown in FIG. 19E by the ion implantation method.

Also according to the fifth embodiment, the avalanche multiplying effect can be given to the region which corresponds to the region 30 shown in FIG. 13 upon which light is made incident. According to the fifth embodiment, the side wall 55 is removed before ions are injected. Therefore, the distance between the source and the drain diffusion layers in the region which corresponds to the region 30 shown in FIG. 13 becomes shorter than the distance between the source and the drain diffusion layers in the other regions. Therefore, the conductance of the device is determined by the region which corresponds to the region 30 shown in FIG. 13. It is apparent that the above-described problem can be prevented by constituting the structure in such a manner that the gate length in the region which corresponds to the region 30 shown in FIG. 30 is previously made to be longer than the gate length in the other regions by at least the width of the side wall. The above-described method in which the gate length of the portion which corresponds to the region 30 is made to be longer than the other portion can be applied to the above-described fourth embodiment.

The above-described second and the third embodiments are arranged to improve the process and the structure before the gate electrode is formed, while the fourth and the fifth embodiments are arranged to improve the process and the structure after the gate electrode has been formed. However, a combination of the second or the third embodiment and the fourth or the fifth embodiment by be combined with each other, resulting a further improved effect to be obtained.

Then, a sixth embodiment of the present invention will now be described with reference to FIGS. 20A to 20E. FIGS. 20A and 20B are plan views which illustrates a portion corresponding to the region 30 shown in FIG. 13 according to the sixth embodiment. Referring to the drawings, symbol a represents a gate electrode terminal. That is, according to this embodiment, the structure is arranged in such a manner that the gate electrode terminal a which corresponds to the region 30 projects over the circular gate terminal. Referring to FIG. 20A or 20B, a high density diffusion layer made of an impurity such as As is formed in region b designated by slant lines by the ion implantation method before the gate insulating film or the gate electrode is formed.

The above-described process will now be described with reference to cross sectional views 20C to 20E each of which is taken along line A–A' of FIG. 20A. Referring to FIG. 20C, reference numeral 61 represents a semiconductor substrate and 62 represents a pad oxidized film or a gate insulating film. Furthermore, a resist film 63 is, by the photolithography method, formed in such a manner that only the region b shown in FIG. 20A or 20B is opened on the surface of the pad oxidized film or the gate insulating film 62. Then, a high density diffusion layer 64 is formed by the ion implantation method. Then, the resist film 63 is removed before the pad oxidized film is removed to oxidize the gate in a case where the insulating film 62 is the pad oxidized film. Then, as shown in FIG. 20D, a polysilicone gate electrode film 65 is, by the LPCVD method, deposited on the surface of the wafer so that a resist film 66 for use in patterning the gate electrode is formed by the photolithography method. The resist film 66 is used as a mask so that an unnecessary portion of the gate electrode film 65 is removed by the reactive ion etching method. Then, the resist film 66 is removed before the polysilicone oxidizing process and the ion implantation process for forming the source and the drain are performed. As a result, the cross section of the waver becomes as shown in FIG. 20E so that a drain diffusion layer 67 is formed. Referring to the drawings, reference numeral 65' represents an oxidized film formed on the polysilicone gate electrode, 68 represents an oxidized film formed on the semiconductor substrate and 69 represents a gate bird's beak formed by the polysilicone oxidation process.

According to this embodiment, the high density diffusion layer 64 (which is made of an impurity of the same type as that which forms the source and the drain diffusion layer) is formed at an inner position than the position of the gate bird's beak 69. Therefore, the distance between the gate and the drain is determined by only the thickness of the gate insulating film regardless of the polysilicone oxidizing conditions.

The sixth embodiment is arranged in such a manner that the gate insulating film comprises the insulating film 62 having a predetermined thickness. However, a further improved effect can, of course, be obtained from this embodiment in a case where the thickness of the insulating film in a region which corresponds to the region 30 shown in FIG. 30 is made to be thinner than that of the insulating films in the other regions.

Furthermore, although the sixth embodiment is arranged in such a manner that the pattern (plane shape) of the high density diffusion layer 64 comprises the region b shown in FIGS. 20A and 20B, a variety of modifications can be employed if the avalanche effect is generated in the region which corresponds to the region 30 and and as well as the conductance of the CMD is not affected. Also this embodiment can be applied to a structure of the above-described type and therefore this embodiment is not limited to the plane shape formed as the region b shown in FIGS. 20A and 20B.

Figure 21A:
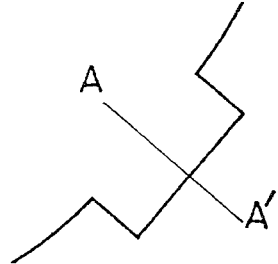
FIGS. 21A to 21F illustrate the plan and cross sectional structures of the CMD according to a seventh embodiment of the present invention.
Figure 21B:
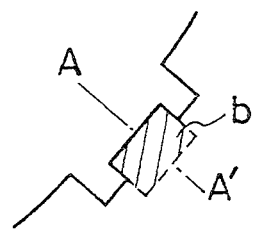

Then, a seventh embodiment of the present invention will now be described with reference to FIGS. 21A to 21F. FIGS. 21A to 21B are plane structural views which illustrate a region which corresponds to the region 30 shown in FIG. 13 according to this embodiment. Similarly to the sixth embodiment, the gate length in the region corresponding to the region 30 is made to be longer than that in the other regions. FIGS. 21C to 21F are cross sectional views taken along line A–A' of FIGS. 21A and 21B and illustrating the cross sections in accordance with the process flow. Although the description will be made hereinafter in accordance with the order of the process flow, the state shown in FIG. 21A corresponds to the cross sectional structure shown in FIG. 21D.

Figure 21C:
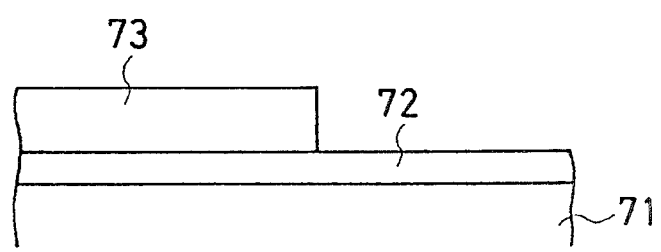
Figure 21D:
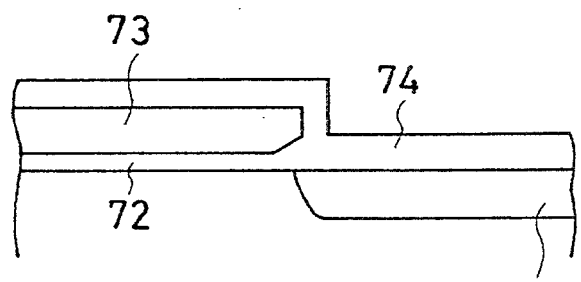
Figure 21E:
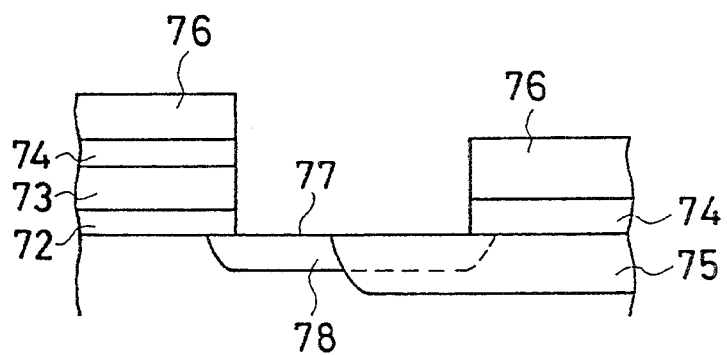

First, as shown in FIG. 21C, a gate insulating film 72 and a gate electrode 73 are formed on the semiconductor substrate 71. Then, by the oxidizing the polysilicone, and the ion implantation and annealing process for forming the source and the drain layers, the surface insulating film 74 and the drain (source) diffusion layer 75 are formed as shown in FIG. 21D. Then, in order to open only the region b designated by the slant lines shown in FIG. 21B, the resist film 76 is formed on the surface of the semiconductor by the photolithography method. Then, the insulating film 74, the gate electrode 73 and the gate insulating film 72 in the slant line region b shown in FIG. 21B are removed by the reactive etching method so that the surface 77 of the semiconductor in the region b is exposed outside. Then, the impurity of the same type as that which forms the drain (source) diffusion layer 75 is injected into the semiconductor substrate so that a high density diffusion layer 78 is formed. As a result of the above-described processes, a structure shown in FIG. 21E is realized. Then, the resist film 76 is removed before an insulating film 79 is formed on the surface of the semiconductor by the LPCVD method. As a result, a structure shown in FIG. 21F is realized so that a device structure according to this embodiment is completed.

Figure 21F:
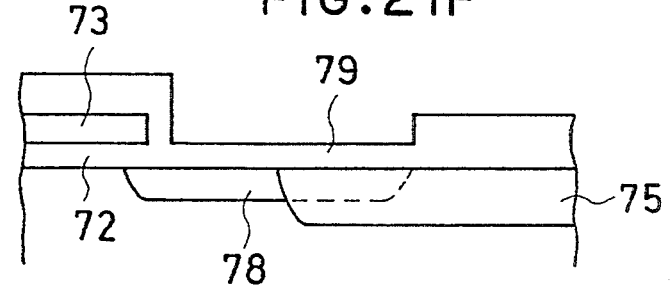

As can be clearly seen from the structure shown in FIG. 21F, the gate electrode 73, the gate insulating film 72 and the high density diffusion layer 78 are formed by the processes which require precise processing technology such as the gate oxidation process, the reactive ion etching method, the ion implantation method or the like. Therefore, according to this embodiment, the intensity of the electric field between the gate electrode 73 and the high density diffusion layer 78 can significantly stably be controlled. Also the plane structure which corresponds to the region 30 shown in FIG. 13 according to this embodiment is not limited to the structure shown in FIG. 21B similarly to the sixth embodiment. A variety of modifications may be employed in a range of the process shown in FIGS. 21C to 21F.

Figure 22A:
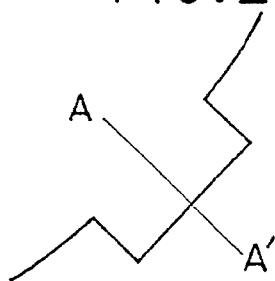
FIGS. 22A to 22F illustrate the plan and cross sectional structures of the CMD according to an eighth embodiment of the present invention.
Figure 22B:
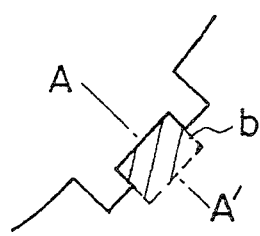

Then, an eighth embodiment of the present invention will now be described with reference to FIGS. 22A to 22F. The same or equivalent elements to those according to the seventh embodiment shown in FIGS. 21A to 21F are given the same reference numerals. FIGS. 22A and 22B are plan structural views which illustrates the region corresponding to the region 30 shown in FIG. 13 according to this embodiment. Similarly to the sixth embodiment, the gate length in the region corresponding to the region 30 shown in FIG. 13 is made to be longer than the gate length in the other regions. FIGS. 22C to 22F are cross sectional views taken along line A–A' of FIGS. 22A and 22B and illustrating the cross sections in accordance with the process flow. Although the description will be made hereinafter in accordance with the order of the process flow, the state shown in FIG. 22A corresponds to the cross sectional structure shown in FIG. 22D.

Figure 22C:
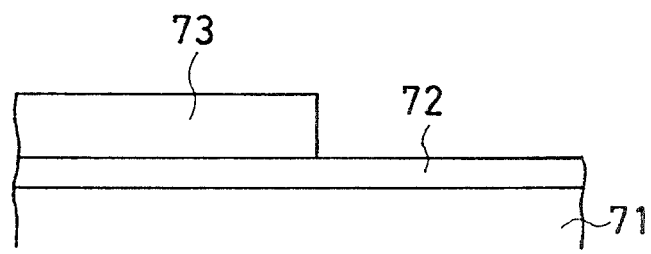
Figure 22D:
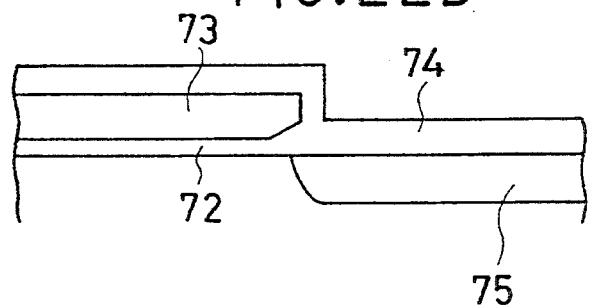
Figure 22E:
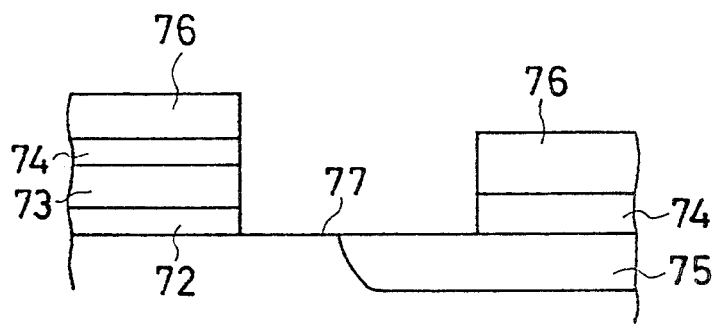
Figure 22F:
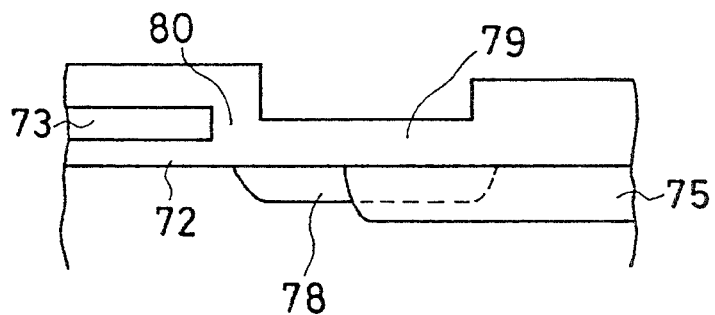

First, as shown in FIG. 22C and similarly to the seventh embodiment, the gate insulating film 72 and the gate electrode 73 are formed on the semiconductor substrate 71. Then, by the oxidizing the polysilicone, and the ion injection and the annealing process for forming the source and the drain layers, the surface insulating film 74 and the drain (source) diffusion layer 75 are formed as shown in FIG. 22D. Then, in order to open only the region b designated by the slant lines shown in FIG. 22B, the resist film 76 is formed on the surface of the semiconductor by the photolithography method. Then, the insulating film 74, the gate electrode 73 and the gate insulating film 72 in the slant line region b shown in FIG. 22B are removed by the reactive etching method so that the surface 77 of the semiconductor in the region b is exposed outside as shown in FIG. 22E. Then, the resist film 76 is removed before the insulating film 79 made of $SiO_2$ or $Si_3N_4$ is, by the LPCVD method, formed on the surface 77 of the semiconductor as shown in FIG. 22F. Then, by the ion implantation method, the high density diffusion layer 78 of the same impurity type as that of the drain layer 75 is formed. Depending upon the thickness of the insulating film 79, a process in which the entire surface is anisotropically etched back is performed prior to the ion implantation by the reactive ion etching method after the above-described insulating film 79 has been formed.

According to this embodiment, the intensity of the electric field is determined by the horizontal distance between the end portion of the gate electrode 73 and that of the diffusion layer 78 which are insulated from each other by a side spacer 80 shown in FIG. 22F. Furthermore, the distance between the gate electrode 73 and the high density diffusion layer 78 is set by the processes which require precise processing technology such as the thermal oxidation method, the reactive ion etching method, the LPCVD method, the ion implantation method, the heat treatment and the like. Therefore, the characteristics of this embodiment are established in that the intensity of the electric filed present between the gate electrode 73 and the diffusion layer 78 can significantly stably be controlled. Also according to this embodiment, the plane structure of the region corresponding to the region 30 shown in FIG. 13 is not limited to the structure shown in FIG. 22B similarly to the sixth embodiment. Therefore, it may be variously changed in a range of the processes shown in FIGS. 22C to 22F.

Figure 1:
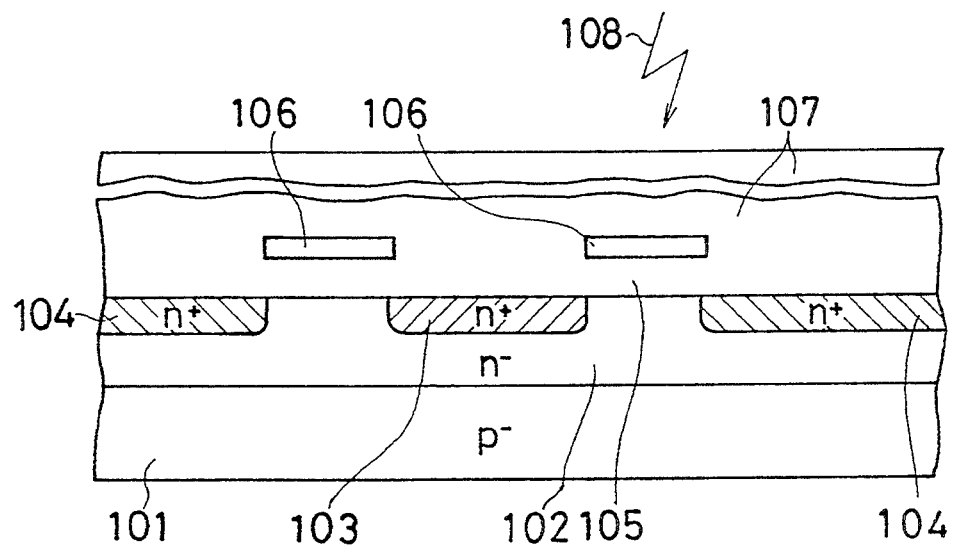
FIG. 1 illustrates a cross sectional structure of a conventional CMD solid state imaging device corresponding to one pixel.
Figure 2:
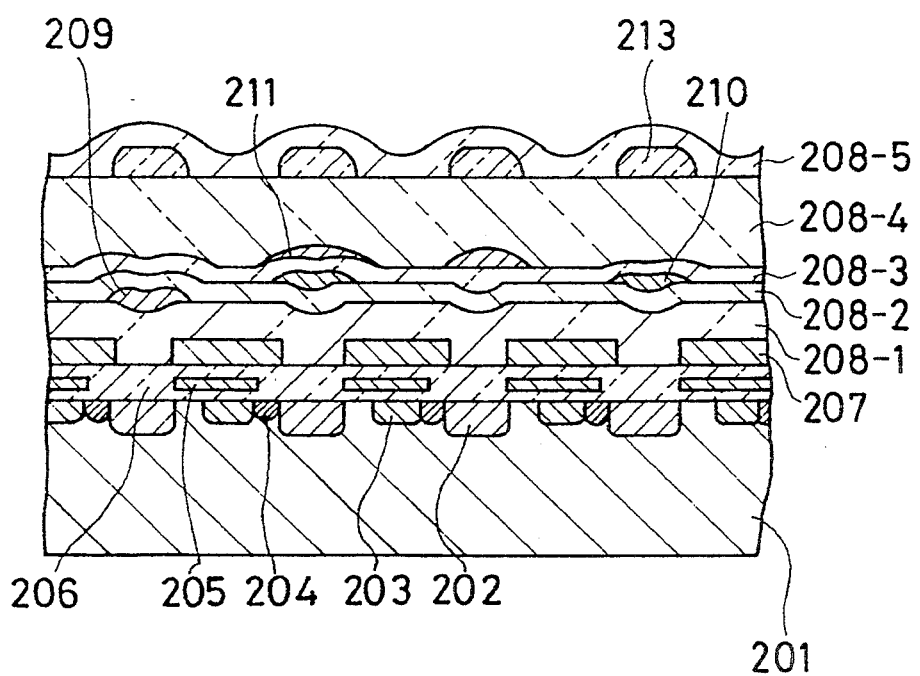
FIG. 2 is a cross sectional view which illustrates an example of the structure of a conventional solid state imaging device having a microlens array disposed on an imaging device.
Figure 3:
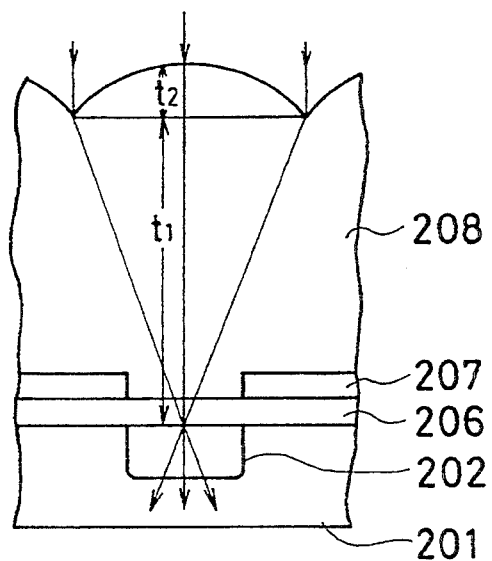
FIG. 3 illustrates an incidental optical path of the solid state imaging device shown in FIG. 2.
Figure 23A:
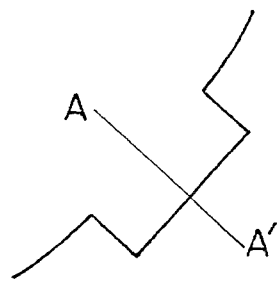
FIGS. 23A to 23F illustrate the plan and cross sectional structures of the CMD according to a ninth embodiment of the present invention.
Figure 23B:
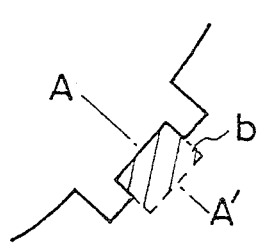

Then, a ninth embodiment of the present invention will now be described with reference to FIGS. 23A to 23F. Referring to FIGS. 23A to 23F, the same or the equivalent elements to those according to the seventh embodiment shown in FIGS. 21A to 21F are given the same reference numerals. FIGS. 23A and 23B are plan structural views which illustrates the region corresponding to the region 30 shown in FIG. 13 according to this embodiment. Similarly to the sixth embodiment, the gate length in the region corresponding to the region 30 shown in FIG. 13 is made to be longer than that in the other regions. FIGS. 23C to 23F are cross sectional views taken along line A-A' of FIGS. 3A and 23B and illustrating the cross sections in accordance with the process flow. Although the description will be made hereinafter in accordance with the order of the process flow, the state shown in FIG. 23A corresponds to the cross sectional structure shown in FIG. 23D.

Figure 23C:
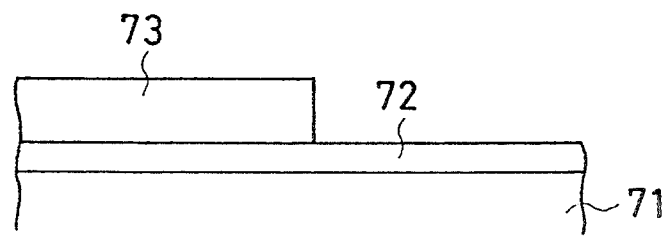
Figure 23D:
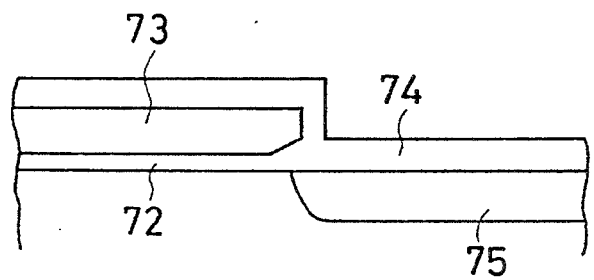
Figure 23E:
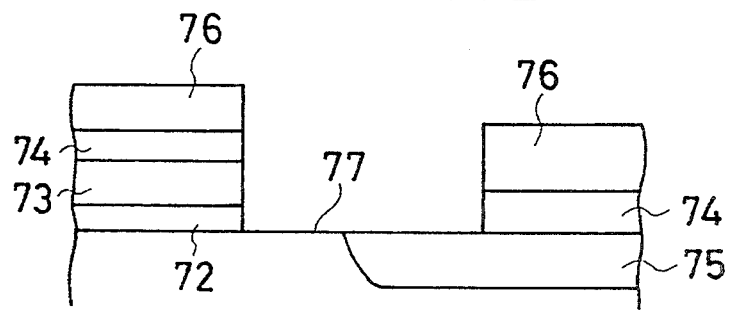

First, as shown in FIG. 23C and similarly to the seventh embodiment, the gate insulating film 72 and the gate electrode 73 are formed on the semiconductor substrate 71. Then, by the oxidizing the polysilicone, and the ion implantation and the annealing process for forming the source and the drain layers, the surface insulating film 74 and the drain (source) diffusion layer 75 are formed as shown in FIG. 23D. Then, in order to open only the region designated by the slant lines shown in FIG. 23B, the resist film 76 is formed on the surface of the semiconductor by the photolithography method. Then, the insulating film 74, the gate electrode 73 and the gate insulating film 72 in the slant line region b shown in FIG. 23B are removed by the reactive etching method so that the surface 77 of the semiconductor in the region b is exposed outside as shown in FIG. 23E.

Figure 23F:
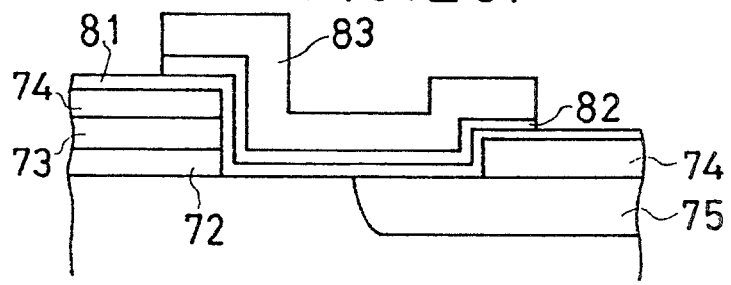

Then, the resist film 76 is removed before an insulating film 81 made of $SiO_2$, $Ta_2O_5$ or $Si_3N_4$ or the like is, by the LPCVD method, formed on the surface of the semiconductor as shown in FIG. 23F. Then, a plate electrode 82 is formed on the entire surface of the wafer by the LPCVD method similarly. In a case where the plate electrode 82 is made of polysilicone, it is preferable that the film thickness be 500Å or less. Then, by the photolithography method, a resist film 83 is formed to cover at least the slant line region b shown in FIG. 23B. The resist film 83 is used as a mask so that the plate electrode 82 in the unnecessary region is subjected to etching. Then, the resist film 83 is removed. The completed state is arranged in such a manner that an independent potential can be applied to the plate electrode 82.

According to this embodiment, the intensity of the potential is determined by the horizontal distance between the gate electrode 73 and the plate electrode 82 which are insulated from each other by the insulating film 81 shown in FIG. 23F. The distance between the gate electrode 73 and the plate electrode 82 can be set precisely since the LPCVD method, which is a process requiring precise processing technology, is employed. Therefore, this embodiment is characterized in that the intensity of the electric field between the gate electrode 73 and the plate electrode 82 can significantly stably be controlled. Also according to this embodiment and similarly to the sixth embodiment, the plane structure of the region corresponding to the region 30 shown in FIG. 13 is not limited to the structure shown in FIG. 23B. Therefore, a variety of modifications may be employed in a range of the processes shown in FIGS. 23C to 23F.

Furthermore, this embodiment is characterized in that the avalanche multiplying factor, that is, the sensitivity can be varied by changing the potential (bias which is more positive than the accumulating potential to be applied to the gate electrode).

Finally, the original characteristic of this embodiment lies in that a high electric field is, in a manner different from the other embodiments, applied to a portion between two adjacent electrodes. The method of realizing the above-described structure may employ not only the above-described method but also a method in which the gap between the direct contact two electrodes is photoetched may be employed thanks to the improvement in the process technology. Furthermore, in a case where the potential of the plate electrode 82 is always the same as the drain potential, a structure may be employed in which a contact hole is formed between the diffusion layer 75 and the plate electrode 82.

Although each of the above-described embodiments is arranged to use the solid state imaging device which employs the N-channel CMD, the present invention may, of course, be applied to a solid state imaging device which employs the P-channel CMD by inversely selecting the bias and its impurity type. Furthermore, although the structure of the CMD according to each of the above-described embodiments is arranged in such a manner that the gate electrode surrounds either of the source or the drain, the present invention may be applied to a solid state imaging device in which the gate electrode surrounds both of the source and the drain or a solid state imaging device in which the same does not surround neither the source nor the drain.

Furthermore, it might, of course, be feasible to employ a structure of a solid state imaging device which employs an imaging device having an avalanche multiplying effect of a type except for the CMD imaging device, the structure being arranged in such a manner that incidental light beams are converged in the avalanche multiplying region by using the microlens. The present invention may, of course, be applied to a solid state imaging device of the above-described type. Although the microlens comprises the on-chip type microlens made of an organic resin according to each of the above-described embodiments, the present invention may be applied to a structure in which a microlens made of inorganic material or a microlens formed by pasting two elements is employed. In addition, the present invention may be applied to a variety of structures in which, for example, a color filter and/or a fluorescent material film having a function of converting the wavelength of incidental light is formed in the lower portion of the microlens.

In addition, according to the present invention, by changing the accumulating gate potential or the plate potential, the avalanche multiplying factor, that is, the sensitivity can be varied. Therefore, a high sensitivity and a wide dynamic range can be achieved. Furthermore, the imaging device according to the present invention can be cooled to operate it at low temperature. In this case, the noise component generated due to the dark current can be reduced and thereby a further raised S/N ratio can be obtained by a degree corresponding to the above-described reduction.

Recently, an example in which the avalanche effect is utilized at the time of the accumulation in the MOS type sensor to perform the multiplying accumulation has been disclosed in a thesis of IEEE Trans. on E. D, Vol. 37, No. 8, 1990, pp. 1861 to 1868. According to the above-described thesis, the MOS type sensor is a sensor of a type in which the potential between the diode and the substrate is changed with the accumulation of the amplified carriers in the photodiode in a state of a floating potential and thereby the avalanche factor is changed. That is, there is a non-linear response in which the ratio of the quantity of incidental light and the number of the carriers to be accumulated in the diode is changed due to the value of the quantity of incidental light. However, according to the present invention, the electric field between the gate and the drain or that between the gate electrode and the plate electrode is not changed even if the photocarriers are accumulated in the gate electrode portion. As a result, the avalanche multiplying factor is not changed, that is, the relationship between the quantity of incident light and the number of the accumulated carriers holds an excellent linear relationship.

As described above with reference to the embodiments, according to the present invention, the photocarriers can be amplified and accumulated in the solid state imaging device having the pixels including the light receiving/accumulating portion. Consequently, the sensitivity can significantly be improved in comparison to that realized by the conventional structure.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

I claim:

1. A solid state imaging device having a pixel array in which a multiplicity of pixels, which includes a light receiving portion and an accumulating portion, are arranged, said solid state imaging device comprising:
   a high electric field applied region provided on a part of said light receiving portion of said pixel and having avalanche multiplication function wherein a cross-sectional area of the high electric field applied region is less than a cross-sectional area of the light receiving portion of said pixel when viewed from a light incident side of said pixel;
   a protection film applied on said pixel array and transparent with respect to visible light; and
   a microlens array which is composed of a multiplicity of microlenses selectively disposed on said protection film to correspond to each of said light receiving pixels and made of organic or inorganic material, wherein the optical axis and the focal point of each of said microlenses are present in the high electric field applied region in the light receiving portion and the accumulation portion of each of said pixels.

2. A solid state imaging device according to claim 1, wherein each of said pixels has the light receiving and accumulating portions of an MOS type structure and a diffusion layer formed in a semiconductor substrate adjacent to said light receiving and accumulating portions of the MOS type structure.

3. A solid state imaging device according to claim 2, wherein said high electric field applied region is formed between an electrode of said light receiving and accumulating portions of said MOS type structure and said diffusion layer.

4. A solid state imaging device having a pixel array in which a multiplicity of pixels, which includes a light receiving portion and an accumulating portion, are arranged, said solid state imaging device comprising:
   a high electric field applied region provided on a part of said light receiving portion of said pixel and having avalanche multiplication function;
   a protective film applied on said pixel array and transparent with respect to visible light; and
   a microlens array which is composed of a multiplicity of microlenses selectively disposed on said protection film to correspond to each of said light receiving pixels and made of organic or inorganic material, wherein the optical axis and the focal point of each of said microlenses are present in the high electric field applied region in the light receiving portion and the accumulation portion of each of said pixels, wherein each of said pixels is made of a CMD having a channel layer formed in a semiconductor substrate, a source region and a drain region formed in said semiconductor substrate while interposing said channel layer and a gate electrode formed on said channel layer while interposing a gate insulating film.

5. A solid state imaging device according to claim 4, wherein said high electric field applied region is formed in the vicinity of said gate electrode of said CMD.

6. A solid state imaging device according to claim 4, wherein said high electric field applied region is formed between said gate electrode of said CMD and said source region or said drain region.

* * * * *